(12) United States Patent
Kamijima

(10) Patent No.: US 7,575,853 B2
(45) Date of Patent: Aug. 18, 2009

(54) METHOD OF FORMING THIN FILM PATTERN AND METHOD OF FORMING MAGNETORESISTIVE ELEMENT

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 487 days.

(21) Appl. No.: 11/083,028

(22) Filed: Mar. 18, 2005

(65) Prior Publication Data
US 2005/0227185 A1    Oct. 13, 2005

(30) Foreign Application Priority Data
Apr. 8, 2004  (JP)  ............... 2004-114324
Apr. 8, 2004  (JP)  ............... 2004-114592

(51) Int. Cl.
*G03F 7/20*  (2006.01)
(52) U.S. Cl. ............. 430/315; 430/320; 430/322; 430/311
(58) Field of Classification Search .......... 430/314, 430/311, 320, 322
See application file for complete search history.

(56) References Cited

U.S. PATENT DOCUMENTS

| | | | |
|---|---|---|---|
| 5,620,909 A * | 4/1997 | Lin et al. ................ | 438/703 |
| 6,253,445 B1 * | 7/2001 | Yoon ................ | 29/603.14 |
| 6,434,814 B1 | 8/2002 | Chang et al. | |
| 6,531,436 B1 * | 3/2003 | Sahbari et al. ........... | 510/176 |
| 6,811,817 B2 * | 11/2004 | Sugeta et al. ............ | 427/256 |
| 7,007,374 B2 * | 3/2006 | Lille ................... | 29/603.16 |
| 7,041,518 B2 * | 5/2006 | Lee et al. ............... | 438/20 |
| 2001/0027029 A1 | 10/2001 | Kamijima | |
| 2003/0036021 A1 * | 2/2003 | Khan et al. ............ | 430/313 |

(Continued)

FOREIGN PATENT DOCUMENTS

JP    A-56-037630    4/1981

(Continued)

*Primary Examiner*—Kathleen Duda
*Assistant Examiner*—Brittany Raymond
(74) *Attorney, Agent, or Firm*—Oliff & Berridge, PLC

(57) ABSTRACT

The present invention provides a thin film pattern forming method capable of forming a thin film pattern having small dimensions at higher precision. A thin film pattern forming method of the invention includes: a step of forming a first thin film on a substrate; a step of forming a bilayer resist pattern; a step of forming a soluble layer as a covering layer; and a step of forming a first thin film pattern by selectively removing the first thin film by dry etching using the bilayer resist pattern as a mask. Since the soluble layer generally and continuously covering the periphery of the bilayer resist pattern and the first thin film in an area other than the area covered with the bilayer resist pattern is formed, deformation of the shape of the bilayer resist pattern can be suppressed at the time of dry etching and a deposition amount of a re-deposit 9 can be also reduced. Consequently, the isolated first thin film pattern having small dimensions and defined by a contour can be formed at higher precision. Further, the first thin film pattern 17 is formed by dry etching and, after that, the bilayer resist pattern covered with the soluble layer is removed by using a solvent which can dissolve both the bilayer resist pattern and the soluble layer. Thus, the first thin film pattern and the bilayer resist pattern can be separated from each other without a hitch.

24 Claims, 25 Drawing Sheets

U.S. PATENT DOCUMENTS

2004/0084685 A1* 5/2004 Yabusaki et al. ............... 257/95
2005/0170628 A1* 8/2005 Sharma et al. ............... 438/612

FOREIGN PATENT DOCUMENTS

| JP | A-63-018631 | 1/1988 |
| JP | A-04-335644 | 11/1992 |
| JP | A-11-175922 | 7/1999 |
| JP | A-2001-226785 | 8/2001 |
| JP | A-2002-204003 | 7/2002 |
| JP | A-2003-142754 | 5/2003 |
| JP | A-2003-517693 | 5/2003 |
| WO | WO 00/36594 A1 | 6/2000 |

* cited by examiner

METHOD OF FORMING THIN FILM PATTERN AND METHOD OF FORMING MAGNETORESISTIVE ELEMENT

BACKGROUND OF THE INVENTION

1. Field of the Invention

The present invention relates to a method of forming a thin film pattern on a substrate and a method of forming a magnetoresistive element including the thin film pattern.

2. Description of the Related Art

Hitherto, in a thin film magnetic head and an electronic/magnetic device such as a semiconductor device, various kinds of thin film patterns are often used. For example, in a thin film magnetic head, a magnetoresistive (MR) element in which magnetic thin films and the like are stacked is used. In a semiconductor device, a wiring pattern constructed by conductive thin films is used. As such thin film patterns, not only a thin film pattern of an island-shape or a band shape, in some cases, a thin film pattern having a through hole is used.

One of methods of forming a thin film pattern is dry etching using a resist pattern as a mask. In the method, first, a thin film is formed on a whole substrate and, after that, a resist pattern having a desired pattern shape is formed by photolithography on the thin film. Subsequently, undercut is formed in the resist pattern. Further, by performing dry etching such as ion milling using the resist pattern in which the undercut is formed as a mask, a thin film pattern having a desired shape is formed. The dry etching is disclosed in, for example, translated national publication of patent application No. 2003-517693.

In recent years, miniaturization of electronic/magnetic devices is proceeding remarkably and, in association with it, a finer thin film pattern is in increasing demand. However, in the case of forming a fine thin film pattern by using the dry etching, it is difficult to obtain a thin film pattern of high precision. Specifically, at the time of forming a fine thin film pattern, the dimension of the resist pattern has to be also reduced. When the dimension of the resist pattern becomes extremely small, the shape of the resist pattern is deformed due to heat or the like applied at the time of dry etching, and an error tends to occur in the dimensions of a thin film pattern to be formed due to displacement from the dimensions of the initial resist pattern formed. In addition, as shown in FIG. 42, an end portion 117T of a resist pattern 105 heated is often rounded. Consequently, at the time of dry etching, a large amount of a re-attachment 109 is attached around the resist pattern 105. The inclination of an end face 117S becomes gentle, and the contour of a thin film pattern 117 becomes unclear. In such circumstances, a thin film pattern forming method capable of realizing high-precision dimensions without causing a trouble in lift-off operation even in the case of using a resist pattern of fine dimensions is requested. In the case of forming a fine thin film pattern by using the dry etching as described above, a problem such that a high-precision thin film pattern cannot be obtained due to occurrence of a burr may occur. To be specific, to form a fine thin film pattern, the dimension of the resist pattern has to be also reduced, so that the width and height of the undercut portion in the resist pattern have to be also reduced. However, when the dimensions of the undercut portion become extremely small, as shown in FIG. 42, part of the thin film removed from above a substrate 101 at the time of dry etching is re-attached as a re-attachment 109 around an end face of an undercut portion 108 of the resist pattern 105. Further, a case occurs such that the resist pattern 105 and the end face or the top face of the thin film pattern 117 to be formed are connected. In such a case, an operation of lifting off the resist pattern 105 becomes impossible. Even if the lift-off operation can be performed, a burr occurs in the peripheral portion of the thin film pattern 117. Therefore, a thin film pattern forming method capable of performing a smooth lift-off operation without causing a burr even in the case of using a resist pattern having small dimensions is desired.

SUMMARY OF THE INVENTION

The present invention has been achieved in consideration of such problems and its first object is to provide a thin film pattern forming method capable of easily forming a thin film pattern having small dimensions. A second object of the invention is to provide a magnetoresistive element forming method using the thin film pattern forming method.

A thin film pattern forming method of the invention includes: a step of forming a first thin film on a substrate; a step of forming a resist pattern; a step of forming a covering layer; and a step of forming a first thin film pattern by selectively removing the first thin film by dry etching using the resist pattern as a mask.

In particular, as a thin film pattern forming method according to a first aspect of the invention, preferably, the resist pattern is formed so as to selectively cover the first thin film, a soluble layer as the covering layer is formed so as to generally and continuously cover the resist pattern and the first thin film and, further, a resist pattern covered with the soluble layer is removed by using a solvent which can dissolve both the resist pattern and the soluble layer. The "soluble layer" denotes here a layer made of an inorganic or organic material which can be dissolved by a predetermined solvent. "To cover continuously" denotes to densely cover the periphery of the resist pattern without interruption.

In the thin film pattern forming method according to the first aspect of the invention, the soluble layer generally and continuously covering the periphery of the resist pattern and the area other than the area covered with the resist pattern is formed. The soluble layer functions as a protection film and, at the time of dry etching using the resist pattern as a mask, occurrence of deformation of the shape of the resist pattern due to heat and the like is suppressed. Since deformation of the shape of the resist pattern is suppressed, deposition of a re-deposit is reduced. In addition, a solvent capable of dissolving both the resist pattern and the soluble layer is used, so that operation of removing the resist pattern covered with the soluble layer is not hindered.

The thin film pattern forming method according to the first aspect of the invention may further include a step of forming a second thin film so as to cover an area from which the resist pattern covered with the soluble layer and the first thin film have been removed. A second thin film pattern may be formed by removing the resist pattern covered with the second thin film.

Preferably, in a thin film pattern forming method according to a second aspect of the invention, the resist pattern is formed so as to selectively cover the first thin film, an undercut portion is formed in the resist pattern, after that, a protection layer as the covering layer is formed so as to cover at least an area other than the undercut portion in the resist pattern and, further, at least the resist pattern covered with the protection layer is removed by using a solvent which can dissolve at least the resist pattern.

In the thin film pattern forming method according to the second aspect of the invention, the undercut portion is formed in the resist pattern and, after that, the protection layer is formed so as to cover at least the portion other than the undercut portion in the resist pattern. Consequently, occurrence of deformation of the shape of the resist pattern due to heat and the like is suppressed at the time of dry etching using the resist pattern as a mask. Further, since deformation of the shape of the resist pattern is suppressed, a deposition amount of a re-deposit is reduced. In addition, the protection layer is not formed in the undercut portion, so that operation of removing the resist pattern is not hindered.

The thin film pattern forming method according to the second aspect of the invention further includes a step of forming a second thin film so as to cover an area from which the resist pattern covered with the protection layer and the first thin film have been removed, and a second thin film pattern may be formed by removing the resist pattern covered with the second thin film.

In the thin film pattern forming method according to the first and second aspects of the invention, the resist pattern of an isolated type having an island or band shape is formed, and the first thin film pattern of an isolated type having the same shape as that of the isolated resist pattern may be formed. Alternately, the resist pattern having an opening is formed, and the first thin film pattern having an opening whose shape is the same as that of the opening of the resist pattern may be formed.

As a thin film pattern forming method according to the third aspect of the invention, preferably, a soluble layer as the covering layer and the resist pattern are sequentially formed on the first thin film, a soluble layer pattern is formed together with the first thin film pattern by selectively removing the first thin film and the soluble layer by performing dry etching using the resist pattern as a mask and, further, at least the soluble layer pattern is removed by using a solvent which can dissolve at least the soluble layer pattern.

In the thin film pattern forming method according to the third aspect of the invention, the soluble layer is formed between the thin film and the resist pattern. Consequently, a structure in which the thin film and the resist pattern are separated from each other by the soluble layer is obtained. Further, the thin film and the soluble layer are selectively removed by dry etching using the resist pattern as a mask, and at least the soluble layer pattern is removed by using a solvent which can dissolve at least the soluble layer pattern. Thus, the thin film pattern and the resist pattern are easily separated from each other. In particular, when the solvent capable of dissolving both the soluble layer pattern and the resist pattern is used and the resist pattern is also removed together with the soluble layer pattern, the forming process is simplified.

A thin film pattern forming method according to the third aspect of the invention may further include a step of forming a second thin film so as to cover an area from which the resist pattern, the first thin film, and the soluble layer have been removed, and a second thin film pattern may be formed by removing at least .the soluble layer pattern. In this case, it is desirable to use, as the solvent, a solvent capable of dissolving also the resist pattern to remove the resist pattern together with the soluble layer pattern.

In the thin film pattern forming method according to the third aspect of the invention, the resist pattern of an isolated type having an island or band shape is formed, and the first thin film pattern of an isolated type and the soluble layer pattern having the same shape as that of the isolated resist pattern may be. formed. Alternately, the resist pattern having an opening is formed, and the first thin film pattern and the soluble layer pattern having an opening whose shape is the same as that of the opening of the resist pattern may be formed.

Preferably, the thin film pattern forming method according to the first to third aspects of the invention further includes a step of forming an undercut portion in the resist pattern.

In the thin film pattern forming method according to the first to third aspects of the invention, the covering layer may be formed by using an inorganic material. In the case of using a metal containing at least copper (Cu) as the inorganic material, it is desirable to use an organic solvent containing at least N-methyl pyrrolidone as the solvent. In the case of using a metal containing at least nickel (Ni) and iron (Fe) as the inorganic material, it is desirable to use an organic solvent containing at least aromatic hydrocarbon, phenol, and octyl benzenesulfonic acid as the solvent.

In the thin film pattern forming method according to the first to third aspects of the invention, the covering layer may be formed by using an organic material. As the organic material, for example, a water soluble resin or diamond like carbon (DLC) can be used. In this case, it is desirable to use, as a solvent, an organic solvent containing at least N-methyl pyrrolidone.

A magnetoresistive element forming method of the invention includes: a step of forming a magnetoresistive film on a substrate; a step of forming a resist pattern; a step of forming a covering layer; and a step of forming a magnetoresistive film pattern by selectively removing the magnetoresistive film by dry etching using the resist pattern as a mask.

In particular, desirably, in a magnetoresistive element forming method according to the first aspect of the invention, the resist pattern is formed so as to selectively cover the magnetoresistive film, a soluble layer as the covering layer is formed so as to generally and continuously cover the resist pattern and the magnetoresistive film and, the method further includes: a step of forming a metal film including at least a ferromagnetic film so as to cover an area from which the resist pattern and the magnetoresistive film covered with the soluble layer have been removed; and a step of forming a pair of metal film patterns including a magnetic domain control layer so as to face each other while sandwiching the magnetoresistive film pattern by removing the resist pattern covered with the soluble layer by using a solvent which can dissolve both the resist pattern and the soluble layer.

In the magnetoresistive element forming method according to the first aspect of the invention, the soluble layer generally and continuously covering the periphery of the resist pattern and the magnetoresistive film in the area other than the area covered with the resist pattern is formed. Consequently, the soluble layer functions as the protection film and occurrence of deformation of the shape of the resist pattern due to heat and the like at the time of dry etching using the resist pattern as a mask is suppressed. Further, deformation of the shape of the resist pattern is suppressed, thereby reducing deposition of a re-deposit. Since the solvent capable of dissolving both of the resist pattern and the soluble layer is used, the operation of removing the resist pattern covered with the soluble layer is not hindered.

Desirably, the magnetoresistive element forming method according to the first aspect of the invention further includes a step of forming an undercut portion in the resist pattern.

Desirably, in a magnetoresistive element forming method according to the second aspect of the invention, the resist pattern is formed so as to selectively cover the magnetoresistive film, an undercut portion is formed in the resist pattern, after that, a protection layer as the covering layer is formed so as to cover at least a portion other than the undercut portion in the resist pattern and, further, the method comprises: a step of forming a metal film including at least a ferromagnetic film so as to cover an area from which the resist pattern and the magnetoresistive film covered with the soluble layer have been removed; and a step of forming a pair of metal film patterns including a magnetic domain control film so as to face each other while sandwiching the magnetoresistive film pattern by removing at least the resist pattern covered with the protection layer by using a solvent which can dissolve at least the resist pattern.

In the magnetoresistive element forming method according to the second aspect of the invention, the undercut portion is formed in the resist pattern and, after that, the protection layer is formed so as to cover at least the portion other than the undercut portion in the resist pattern. Consequently, occurrence of deformation of the shape of the resist pattern due to heat and the like is suppressed at the time of dry etching using the resist pattern as a mask. Further, since deformation of the shape of the resist pattern is suppressed, a deposition amount of a re-deposit is reduced. In addition, the protection layer is not formed in the undercut portion, so that operation of removing the resist pattern is not hindered.

In the magnetoresistive element forming method according to the first and second aspects of the invention, in the step of forming the metal film, it is also possible to form a conductive film on the ferromagnetic film and form a pair of metal film patterns so that each metal film pattern includes a conductive lead layer.

Desirably, in a magnetoresistive element forming method according to the third aspect of the invention, a soluble layer as the covering layer and the resist pattern are sequentially formed on the magnetoresistive film, a soluble layer pattern is formed together with the magnetoresistive film pattern by selectively removing the magnetoresistive film and the soluble layer by performing dry etching using the resist pattern as a mask and, the method further comprises a step of forming a pair of metal film patterns including a magnetic domain control layer so as to face each other while sandwiching the magnetoresistive film pattern by removing at least the soluble layer pattern by using a solvent which can dissolve at least the soluble layer pattern.

In the magnetoresistive element forming method according to the third aspect of the invention, the soluble layer is formed between the magnetoresistive film and the resist pattern. Consequently, a structure in which the magnetoresistive film and the resist pattern are separated from each other by the soluble layer is obtained. Further, the magnetoresistive film and the soluble layer are selectively removed by dry etching using the resist pattern as a mask, and at least the soluble layer pattern is removed by using a solvent which can dissolve at least the soluble layer pattern. Thus, the magnetoresistive film pattern and the resist pattern are easily separated from each other. In particular, when the solvent capable of dissolving both the soluble layer pattern and the resist pattern is used and the resist pattern is also removed together with the soluble layer pattern, the forming process is simplified.

In the magnetoresistive element forming method according to the third aspect of the invention, desirably, in the step of forming the metal film, a conductive film is formed on the ferromagnetic film and the pair of metal film patterns is formed so that each metal film pattern includes a conductive lead layer.

The thin film pattern forming method according to the first aspect of the invention includes: a step of forming a first thin film on a substrate; a step of forming a resist pattern selectively covering the first thin film; a step of forming a soluble layer so as to generally and continuously cover the resist pattern and the first thin film; a step of forming a first thin film pattern by selectively removing the first thin film by dry etching using the resist pattern covered with the soluble layer as a mask; and a step of removing the resist pattern covered with the soluble layer by using a solvent capable of dissolving both the resist pattern and the soluble layer. Consequently, occurrence of deformation of the shape of the resist pattern due to heat and the like at the time of etching is suppressed by the soluble layer functioning as the protection layer, and patterning can be realized more accurately. Therefore, the thin film pattern including the first thin film pattern having small dimensions can be formed at higher precision.

The thin film pattern forming method according to the second aspect of the invention includes: a step of forming a first thin film on a substrate; a step of forming a resist pattern selectively covering the first thin film; a step of forming an undercut portion in the resist pattern and, after that, forming a protection layer so as to cover at least a portion other than the undercut portion in the resist pattern; a step of forming a first thin film pattern by selectively removing the first thin film by dry etching using the resist pattern covered with the protection layer as a mask; and a step of removing at least the resist pattern covered with the protection layer by using a solvent capable of dissolving at least the resist pattern. Consequently, occurrence of deformation of the shape of the resist pattern due to heat and the like at the time of etching is suppressed, and patterning can be realized more accurately. Therefore, the thin film pattern including the first thin film pattern having small dimensions can be formed at higher precision.

The thin film pattern forming method according to the third aspect of the invention includes: a step of forming a first thin film on a substrate; a step of forming a soluble layer on the first thin film; a step of forming a resist pattern on the soluble layer; a step of forming a first thin film pattern and a soluble layer pattern by selectively removing the first thin film and the soluble layer by dry etching using the resist pattern as a mask; and a step of dissolving and removing at least the soluble layer pattern by using a solvent capable of dissolving at least the soluble layer pattern. Consequently, occurrence of deformation of the shape of an end portion of the first thin film pattern is suppressed, and etching can be performed more accurately. Moreover, the first thin film pattern and the resist pattern partitioned by the soluble layer pattern can be separated from each other. Therefore, the thin film pattern including the first thin film pattern having small dimensions can be formed easily at higher precision. In particular, when the solvent capable of dissolving also the resist pattern is used and the resist pattern is removed together with the soluble layer pattern, the forming process is simplified and the cost can be reduced.

The magnetoresistive element forming method according to the first aspect of the invention includes: a step of forming a magnetoresistive film on a substrate; a step of forming a resist pattern selectively covering the magnetoresistive film; a step of forming a soluble layer so as to generally and continuously cover the resist pattern and the magnetoresistive film; a step of forming a magnetoresistive film pattern by selectively removing the magnetoresistive film by dry etching using the resist pattern covered with the soluble layer as a mask; a step of forming a metal film including at least a ferromagnetic film so as to cover the resist pattern covered with the soluble layer and the area from which the magnetoresistive film has been removed; and a step of forming a pair of metal film patterns including a magnetic domain control layer on both sides of the magnetoresistive film pattern by removing the resist pattern covered with the soluble layer by using a solvent capable of dissolving both the resist pattern and the soluble layer. Consequently, occurrence of deformation of the shape of the resist pattern due to heat and the like at the time of etching is suppressed by the soluble layer functioning as the protection layer, and patterning can be realized more accurately. Therefore, the magnetoresistive element including the first magnetoresistive film pattern having small dimensions can be formed at higher precision.

The magnetoresistive element forming method according to the second aspect of the invention includes: a step of forming a magnetoresistive film on a substrate; a step of forming a resist pattern selectively covering the magnetoresistive film; a step of forming an undercut portion in the resist pattern and, after that, forming a protection layer so as to cover at least a portion other than the undercut portion in the resist pattern; a step of forming a magnetoresistive film pattern by selectively removing the magnetoresistive film by dry etching using the resist pattern covered with the protection layer as a mask; a step of forming a metal film including at least a ferromagnetic film so as to cover the resist pattern covered with the protection layer and the area from which the magnetoresistive film has been removed; and a step of removing at least the resist pattern covered with the protection layer by using a solvent capable of dissolving at least the resist pattern, thereby forming a pair of metal film patterns including a magnetic domain control film on both sides of the magnetoresistive film pattern. Consequently, occurrence of deformation of the shape of the resist pattern due to heat and the like at the time of etching is suppressed, and patterning can be realized more accurately. Therefore, the magnetoresistive element including the magnetoresistive film pattern having small dimensions can be formed at higher precision.

The magnetoresistive element forming method according to the third aspect of the invention includes: a step of forming a magnetoresistive film on a substrate; a step of forming a soluble layer on the magnetoresistive film; a step of forming a resist pattern on the soluble layer; a step of forming a magnetoresistive film pattern and a soluble layer pattern by selectively removing the magnetoresistive film and the soluble layer by dry etching using the resist pattern as a mask; a step of forming a metal film including at least a ferromagnetic film so as to cover the resist pattern and the area from which the magnetoresistive film and the soluble layer have been removed; and a step of forming a pair of metal film patterns including a magnetic domain control layer on both sides of the magnetoresistive film pattern by removing at least the soluble layer pattern by using a solvent capable of dissolving at least the soluble layer pattern. Consequently, occurrence of deformation of the shape of an end portion of the magnetoresistive film pattern is suppressed, and etching can be performed more accurately. Moreover, the magnetoresistive film pattern and the resist pattern partitioned by the soluble layer pattern can be easily separated from each other. Therefore, the magnetoresistive element including the magnetoresistive film pattern having smaller dimensions can be formed easily at higher precision. In particular, when the solvent capable of dissolving also the resist pattern is used and the resist pattern is removed together with the soluble layer pattern, the forming process is simplified and the cost can be reduced.

Other and further objects, features and advantages of the invention will appear more fully from the following description.

DETAILED DESCRIPTION OF THE PRFERRED EMBODIMENTS

Embodiments of the invention will be described in detail hereinbelow with reference to the drawings.

First Embodiment

First, by referring to FIGS. 1A and 1B to FIG. 7, a thin film pattern forming method according to a first embodiment of the invention will be described hereinbelow.

Figure 1A:
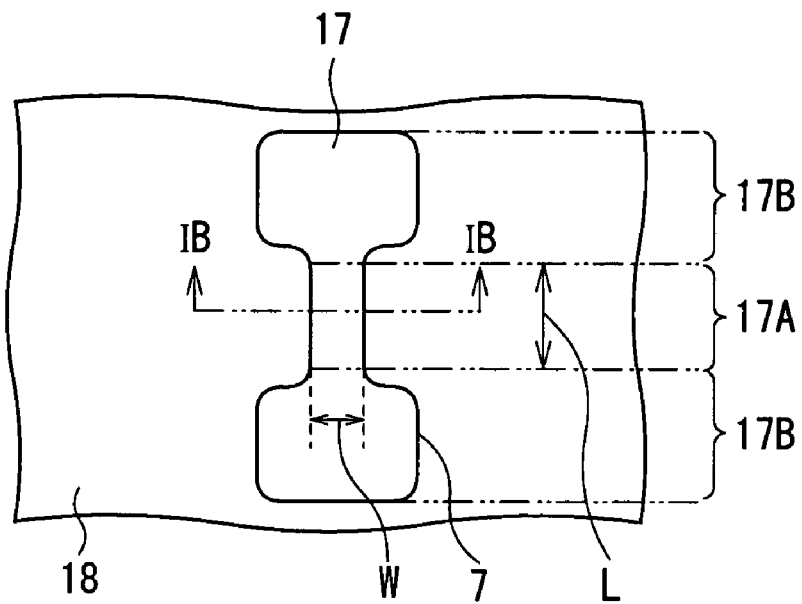
FIGS. 1A and 1B are front view and cross section, respectively, showing a thin film pattern formed by a thin film pattern forming method according to a first embodiment of the invention.
Figure 1B:
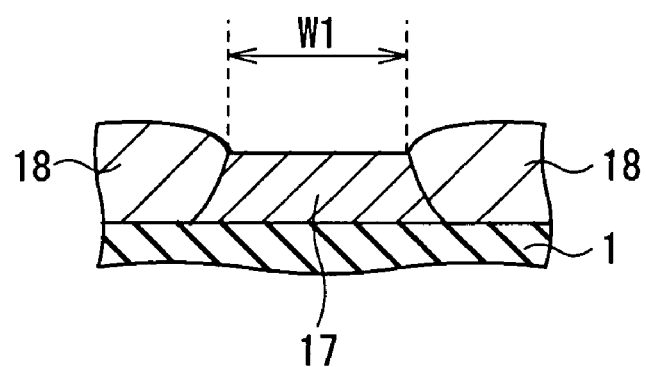

FIGS. 1A and 1B show a first thin film pattern 17 formed on a substrate 1 in which a predetermined function film is formed as necessary on a substrate made of altic ($Al_2O_3 \cdot TiC$) or the like and having an island pattern shape defined by a contour 7, and a second thin film pattern 18 covering the periphery of the first thin film pattern 17. FIG. 1A shows a plane configuration and FIG. 1B shows a sectional configuration taken along line IA-IA of FIG. 1A.

The first thin film pattern 17 has a plane shape constructed by, as shown in FIG. 1A, for example, a first area 17A having small width W (for example, 0.18 μm) and length L (for example, 3 μm), and a pair of second areas 17B adjacent to both ends of the first area 17A and each having an almost square shape. The material of the first and second thin film patterns 17 and 18 may be, for example, a conductive material or an insulating material. Alternately, it may be a magnetic material or a non-magnetic material. The structure of the first and second thin film patterns 17 and 18 may be a single-layer structure or a stacked structure in which a plurality of layers are stacked.

A method of forming the first and second thin film patterns 17 and 18 includes: a step of forming a first thin film which will become the first thin film pattern 17 on the substrate 1; a step of forming a resist pattern selectively covering the first thin film; a step of forming a soluble layer so as to continuously cover the resist pattern and the whole first thin film; a step of forming a first thin film pattern by selectively removing the first thin film by dry etching using the resist pattern covered with the soluble layer as a mask; and a step of removing the resist pattern covered with the soluble layer by using a solvent which can dissolve both the resist pattern and the soluble layer. Each of the steps will be described in detail below.

Figure 2:
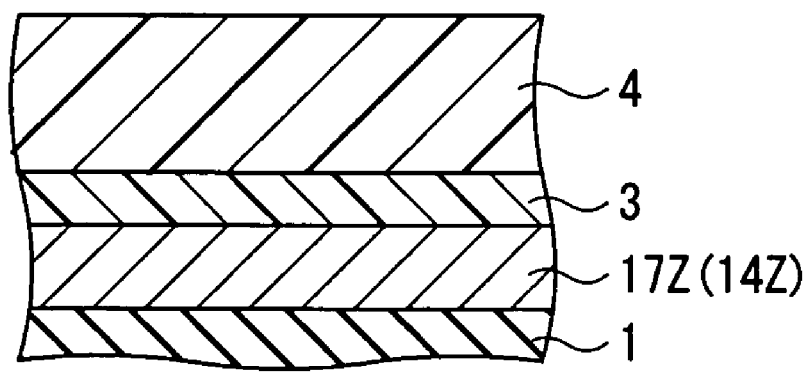
FIG. 2 is a cross section showing a process in the method of forming the thin film pattern illustrated in FIGS. 1A and 1B.

First, as shown in FIG. 2, a first thin film 17Z which will become the first thin film pattern 17 obtained finally is formed on the whole face of the substrate 1 by sputtering using, for example, tantalum (Ta) as the component material.

Next, a lower resist layer 3 and an upper resist layer 4 are sequentially stacked by using, for example, spin coating so as to cover the whole first thin film 17Z. In this case, for example, a resist material whose main component is polymethylglutarimide (PMGI) as an alkali soluble resin is applied and heating process is performed as necessary, thereby forming the lower resist layer 3 so as to have a thickness of about 50 nm. After that, for example, a positive resist material whose main component is polyhydroxy styrene is applied and heating process is performed as necessary, thereby forming the upper resist layer 4 so as to have a thickness of about 0.5 μm.

Figure 3:
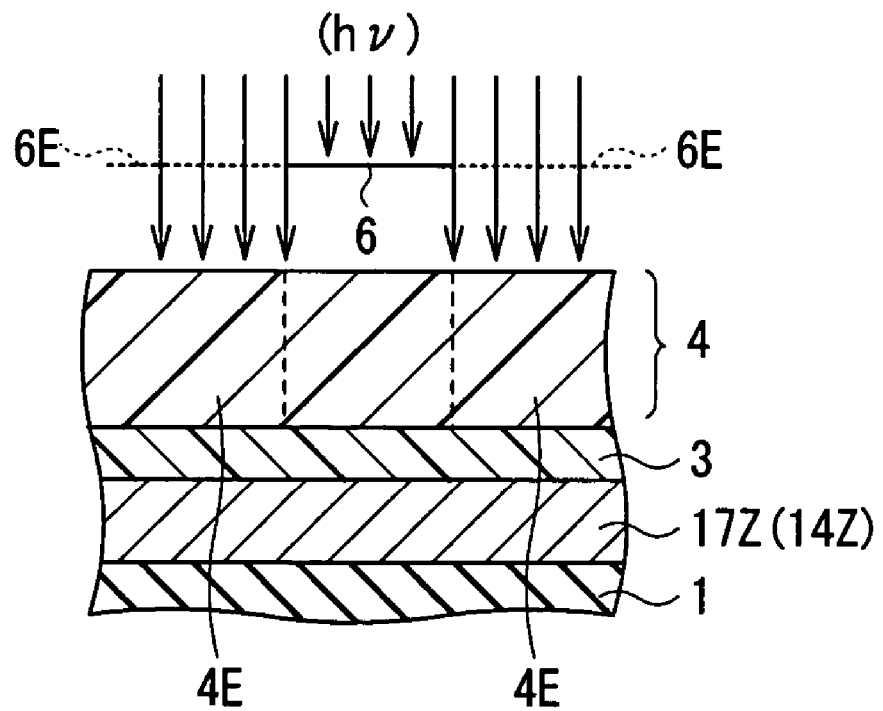
FIG. 3 is a cross section showing a process subsequent to FIG. 2.
Figure 4A:
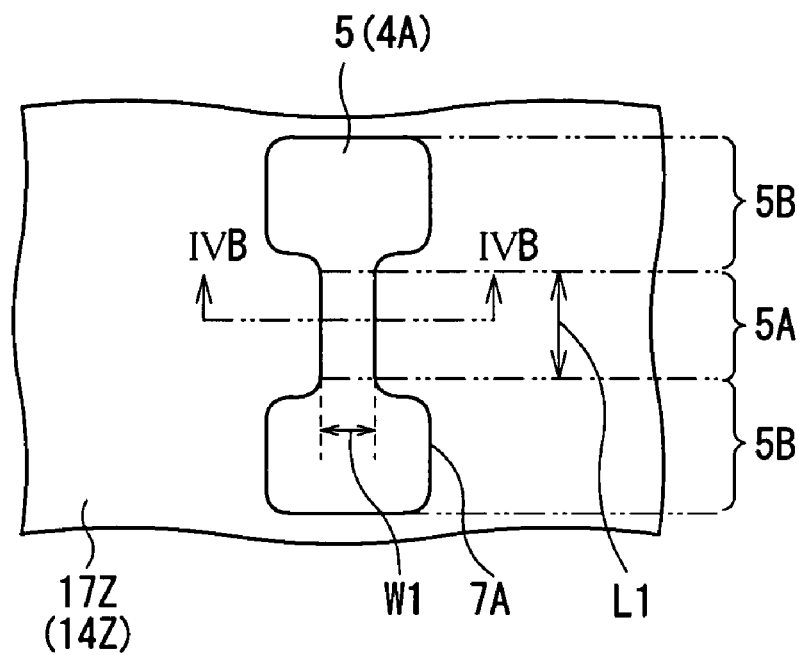
FIGS. 4A and 4B are plan view and cross section, respectively, showing a process subsequent to FIG. 3.
Figure 4B:
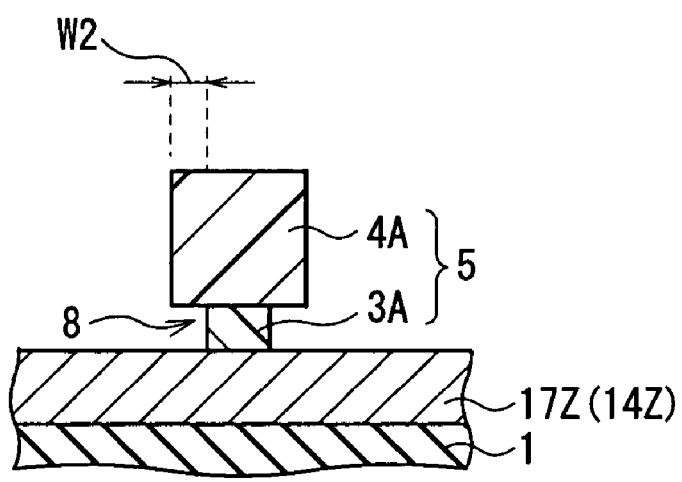

Subsequently, by performing photolithography process on the lower resist layer 3 and the upper resist layer 4, a bilayer resist pattern 5 is formed. Concretely, first, as shown in FIG. 3, by selectively exposing the lower and upper resist layers 3 and 4 to light via a photo mask 6 having openings 6E each having a predetermined shape, a latent image portion 4E is formed. After that, for example, heating process is performed for 60 seconds in the atmosphere of 120° C., further, development is performed by dissolving and removing part of the latent image portion 4E and part of the lower resist layer 3 by using a predetermined developer (for example, tetramethyl ammonium hydroxide aqueous solution) and washing and drying is performed. In such a manner, as shown in FIGS. 4A and 4B, the isolated bilayer resist pattern 5 constructed by a lower layer portion 3A and an upper layer portion 4A and having an island shape defined by a contour 7A is formed. As shown in FIG. 4A, for example, the bilayer resist pattern 5 includes a first area 5A having dimensions (width W1 and length L1) corresponding to width W and length L of the first thin film pattern 17 to be formed and a pair of second areas 5B adjacent to both ends of the first area 5A and each having an almost square shape. FIG. 4A shows a plane configuration in the process subsequent to FIG. 3, and FIG. 4B shows a sectional configuration taken along line IVB-IVB of FIG. 4A.

In this case, the alkali soluble resin is used for the lower resist layer 3 so that, by using an alkali developer, an undercut portion 8 as shown in FIG. 4B can be formed. The width W2 of the undercut portion 8 can be controlled by, for example, concentration of the developer and development time. The optimum value of the width W2 is to be determined in consideration of various conditions such as the material and thickness of the first thin film 17Z, the size of the bilayer resist pattern, thickness of each of the lower and upper layer portions 3A and 4A, and a method of dry etching.

Figure 5A:
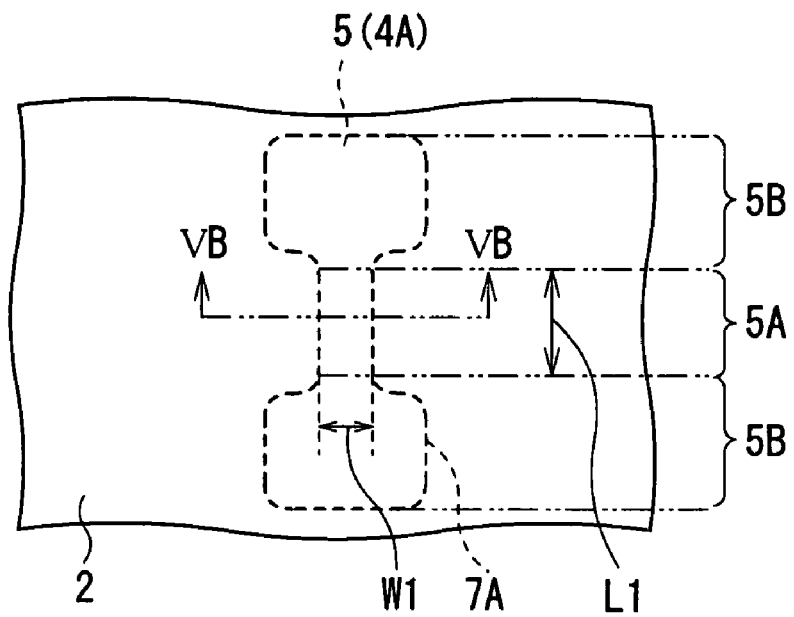
FIGS. 5A and 5B are plan view and cross section, respectively, showing a process subsequent to FIG. 4.
Figure 5B:
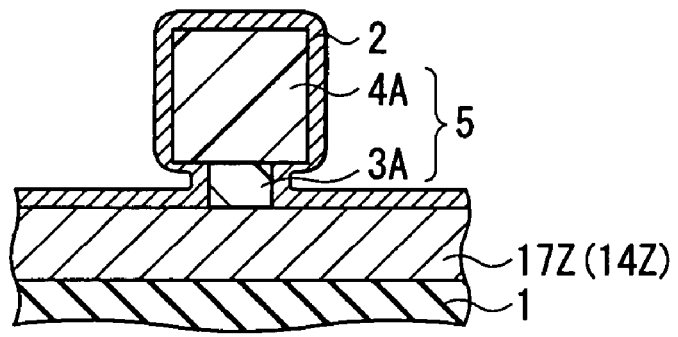

Next, as shown in FIGS. 5A and 5B, a soluble layer 2 is formed by using, for example, sputtering so as to generally and continuously cover both of the bilayer resist pattern 5 and the first thin film 17Z in the area other than the area covered with the bilayer resist pattern 5. In this case, the soluble layer 2 is formed by using copper (Cu) as the material so as to have a thickness of 0.5 nm.

Figure 6:
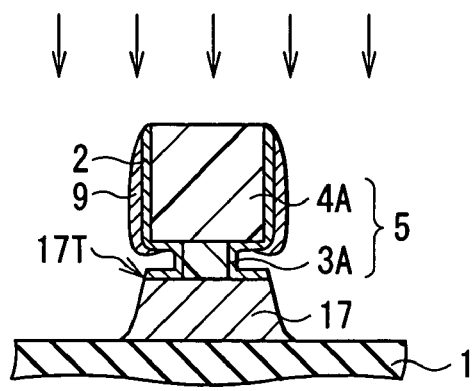
FIG. 6 is a cross section showing a process subsequent to FIGS. 5A and 5B.
Figure 42:
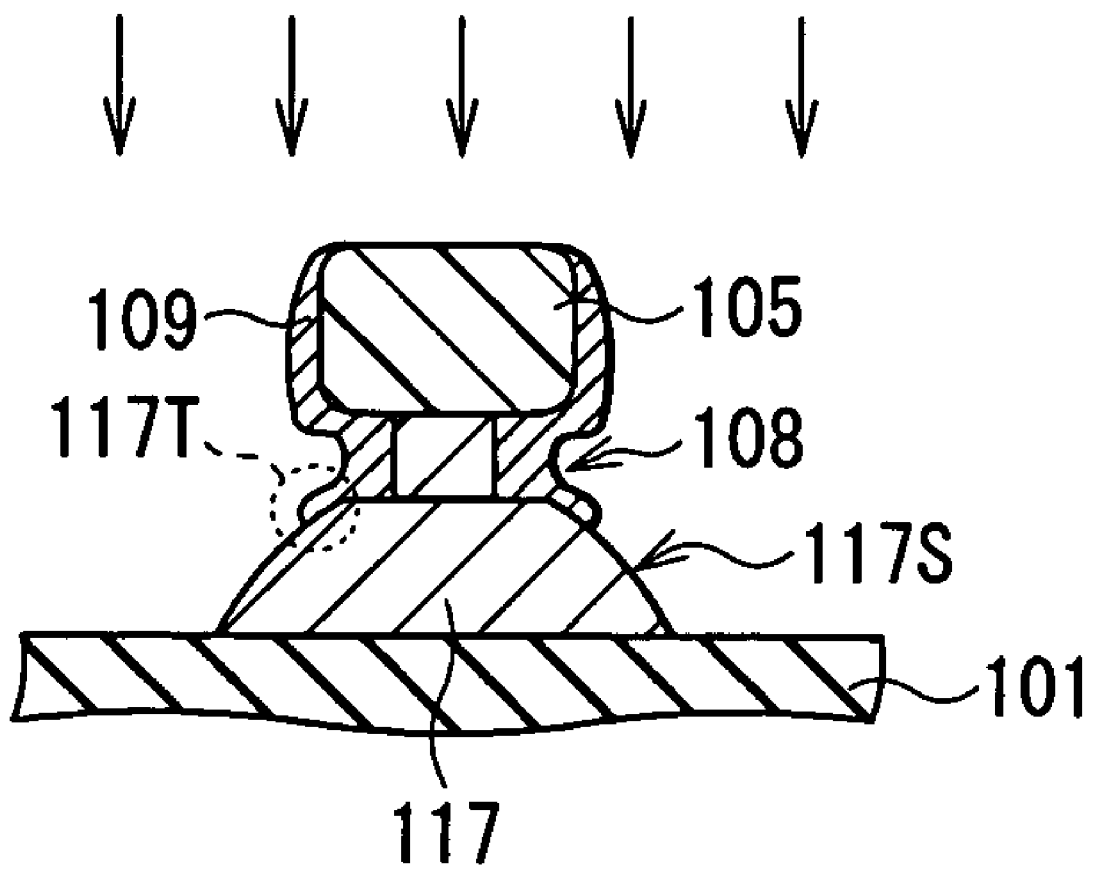
FIG. 42 is a cross section showing a process in a conventional thin film pattern forming method.

After formation of the soluble layer 2, as shown in FIG. 6, the first thin film 17Z is selectively etched by using the bilayer resist pattern 5 covered with the soluble layer 2 as a mask by dry etching such as ion milling or reactive ion etching (RIE), thereby forming the isolated first thin film pattern 17 having the same island shape as that of the bilayer resist pattern 5. At the time of the etching operation, part of the first thin film 17Z removed once from the substrate 1 and spread is re-attached as a re-deposit 9 to the end face of the bilayer resist pattern 5 via the soluble layer 2. The soluble layer 2 formed on the top face of the bilayer resist pattern 5 is partly or entirely removed by the etching operation. Since the soluble layer 2 functions as a protection film in this case, occurrence of deformation of the shape of the bilayer resist pattern 5 due to heat of the dry etching or the like as shown in FIG. 42 can be suppressed. Because of suppression of the deformation of the shape of the bilayer resist pattern 5, deposition of the re-deposit 9 can be reduced. Since the dry etching is performed in a state where the first thin film 17Z is covered with the soluble layer 2, there is also an advantage such that occurrence of shape deformation of an end 17T of the first thin film pattern 17 to be patterned is suppressed. In the case where the soluble layer 2 is not formed, like the conventional thin film pattern 117 shown in FIG. 25, the shape of the end 117T is deformed and rounded. In contrast, in the embodiment, occurrence of deformation of the shape of the end 17T is suppressed. Thus, the first thin film pattern 17 is defined more accurately in accordance with the contour 7A of the bilayer resist pattern 5.

Figure 7:
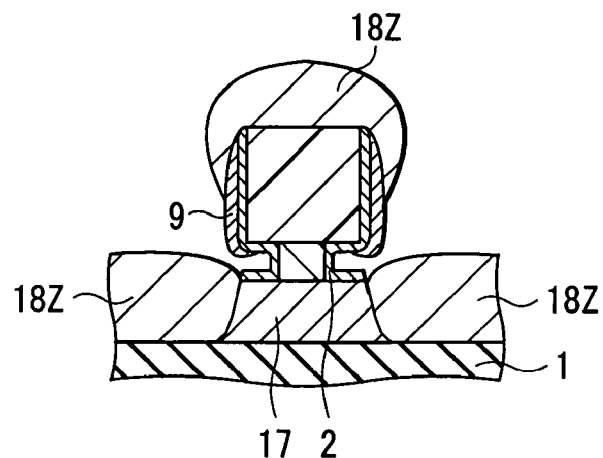
FIG. 7 is a cross section showing a process subsequent to FIG. 6.
Figure 8:
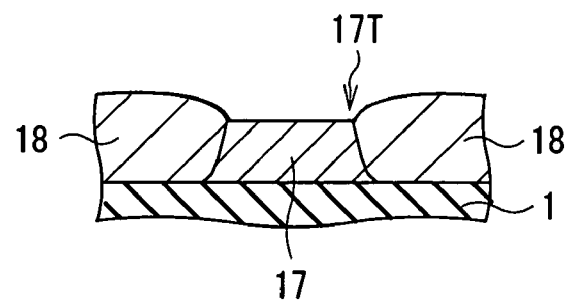
FIG. 8 is a cross section showing a process subsequent to FIG. 7.

After that, as shown in FIG. 7, a second thin film 18Z is formed by sputtering or the like by using, for example, gold (Au) as the material so as to cover the substrate 1 exposed by the etching and the bilayer resist pattern 5. Finally, the bilayer resist pattern 5 covered with the second thin film 18Z is removed by lift-off operation. By using a predetermined solvent capable of dissolving both the bilayer resist pattern 5 and the soluble layer 2, for example, an organic solvent such as N-methyl pyrrolidone held at 50° C., the bilayer resist pattern 5 and the soluble layer 2 are dissolved and removed by a single operation, so that the lift-off operation can be performed without a hitch. By the operation, as shown in FIG. 8, a thin film pattern which has the isolated first thin film pattern 17 having an island shape defined by the contour 7 and the second thin film pattern 18 surrounding the first thin film pattern 17 and disposed adjacent to the periphery of the first thin film pattern 17 is completed.

As described above, according to the embodiment, the soluble layer 2 generally and continuously covering both of the periphery of the bilayer resist pattern 5 and the first thin film 17Z in the area other than the area covered with the bilayer resist pattern 5 is formed. Consequently, at the time of dry etching, deformation of the shape of the bilayer resist pattern 5 can be suppressed and a deposition amount of the re-deposit 9 can be also reduced. Thus, the isolated first thin film pattern 17 having small dimensions and defined by the contour 7 can be formed at higher precision. Further, the first thin film pattern 17 is formed by dry etching and, after that, the bilayer resist pattern 5 covered with the soluble layer 2 is removed by using a solvent which can dissolve both the bilayer resist pattern 5 and the soluble layer 2. Therefore, the first thin film pattern 17 and the bilayer resist pattern 5 can be separated from each other without a hitch. Moreover, since both of the bilayer resist pattern 5 and the soluble layer 2 are dissolved and removed by a single operation, as compared with the case of performing removing operations with different solvents, the process can be simplified. The shape of the first thin film pattern 17 is not limited to the shape defined by the contour 7 shown in FIG. 1 but may be just a rectangular shape, a circular shape, or an elongated band shape. Also in the case of any of the other shapes, the effects are obtained.

Modification

A modification of the thin film pattern forming method according to the embodiment will now be described with reference to FIGS. 9A and 9B to FIG. 14.

In the foregoing first embodiment, the case of forming the isolated thin film pattern having the same shape as the isolated bilayer resist pattern having an island shape by using the isolated bilayer resist pattern has been described. In the modification, the case of forming a thin film pattern including an opening whose shape is the same as that of a resist pattern including an opening by using the resist pattern will be described.

Figure 9A:
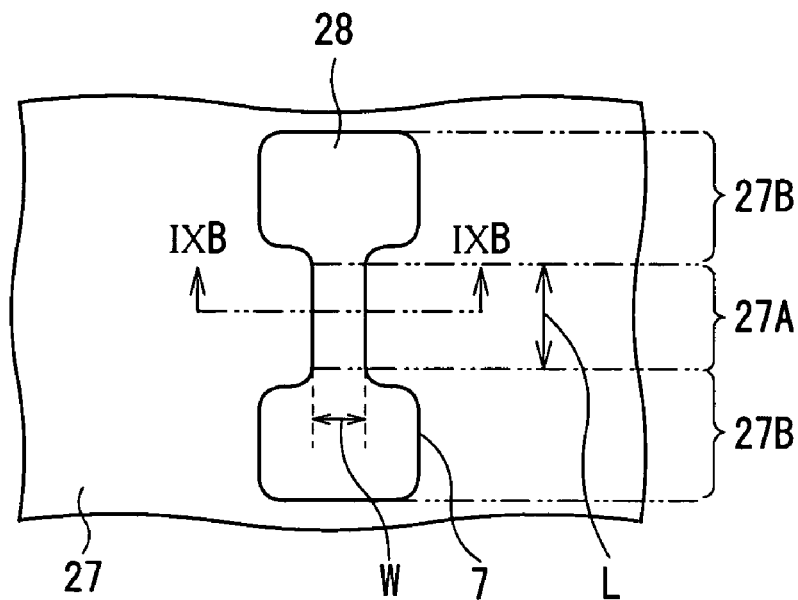
FIGS. 9A and 9B are front view and cross section, respectively, showing a thin film pattern formed by a modification of the thin film pattern forming method according to the first embodiment of the invention.
Figure 9B:
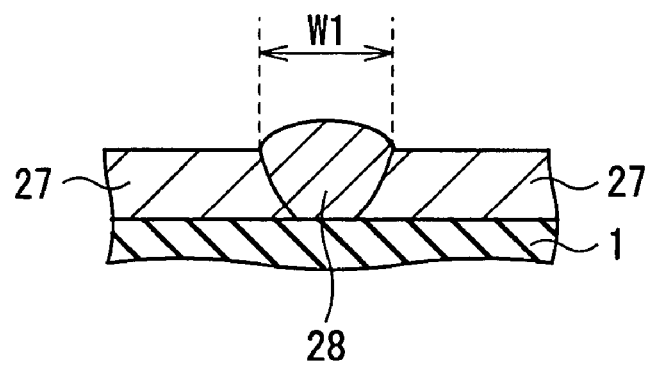

FIGS. 9A and 9B show a first thin film pattern 27 formed on the substrate 1 and having an opening defined by the contour 7 and a second thin film pattern 28 formed so as to close the opening of the first thin film pattern 27. FIG. 9A shows a plane configuration and FIG. 9B shows a sectional configuration taken along line IXB-IXB of FIG. 9A.

The opening in the first thin film pattern 27 has a plane shape constructed by, as shown in FIG. 9A, for example, a first area 27A having width W (for example, 0.18 μm) and length L (for example, 3 μm), and a pair of second areas 27B adjacent to both ends of the first area 27A and each having an almost square shape. A method of forming the first and second thin film patterns 27 and 28 shown in FIGS. 9A and 9B will be described in detail hereinbelow.

First, in a manner similar to the first embodiment, a first thin film 27Z which will become the first thin film pattern 27 (to be described later) obtained finally is formed on the whole face of the substrate 1 by sputtering using, for example, tantalum (Ta) as the component material. Next, in a manner similar to the first embodiment, the lower resist layer 3 and the upper resist layer 4 are sequentially stacked by using, for example, spin coating so as to cover the whole first thin film 27Z.

Figure 10A:
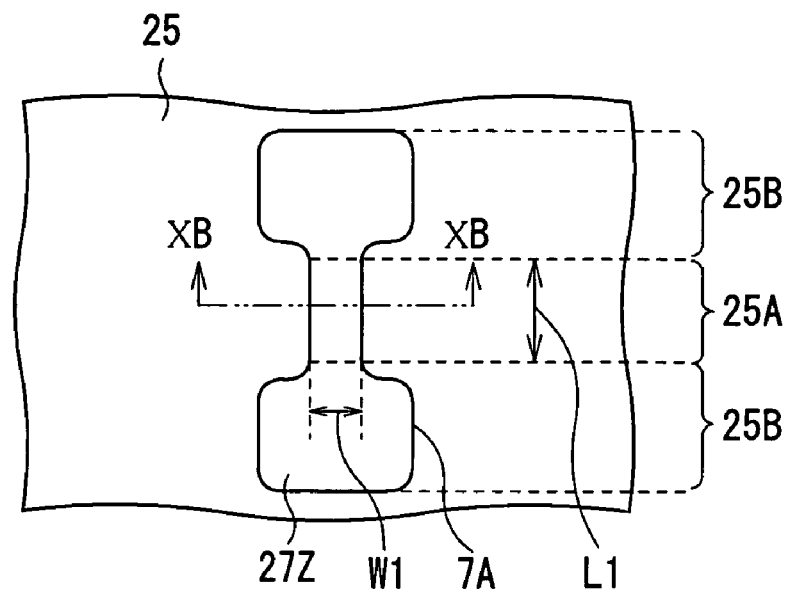
FIGS. 10A and 10B are plan view and cross section, respectively, showing a process in the method of forming the thin film pattern illustrated in FIGS. 9A and 9B.
Figure 10B:
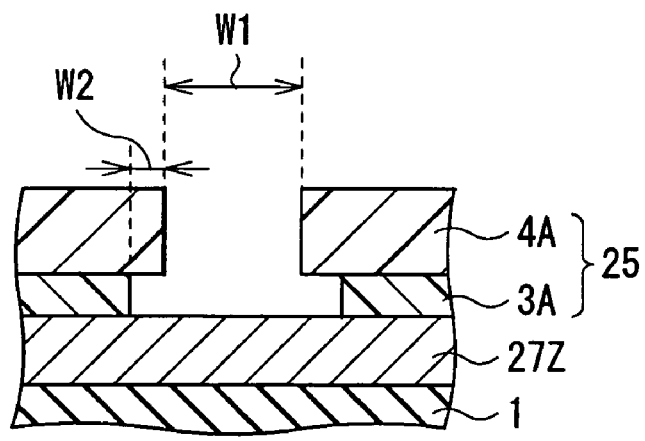

Subsequently, by performing photolithography process on the lower resist layer 3 and the upper resist layer 4, as shown in FIGS. 10A and 10B, a bilayer resist pattern 25 constructed by the lower and upper layer portions 3A and 4A and having an opening defined by the contour 7A is formed. The opening in the bilayer resist pattern 25 includes, as shown in FIG. 10A, for example, a first area 25A having dimensions (width W1 and length L1) corresponding to the width W and length L of the first thin film pattern 27 to be formed and a pair of second areas 25B adjacent to both ends of the first area 25A and each having an almost square shape. FIG. 10A shows a plane configuration in a process of the thin film pattern forming method of the modification, and FIG. 10B shows a sectional configuration taken along line XB-XB of FIG. 10A.

Figure 11A:
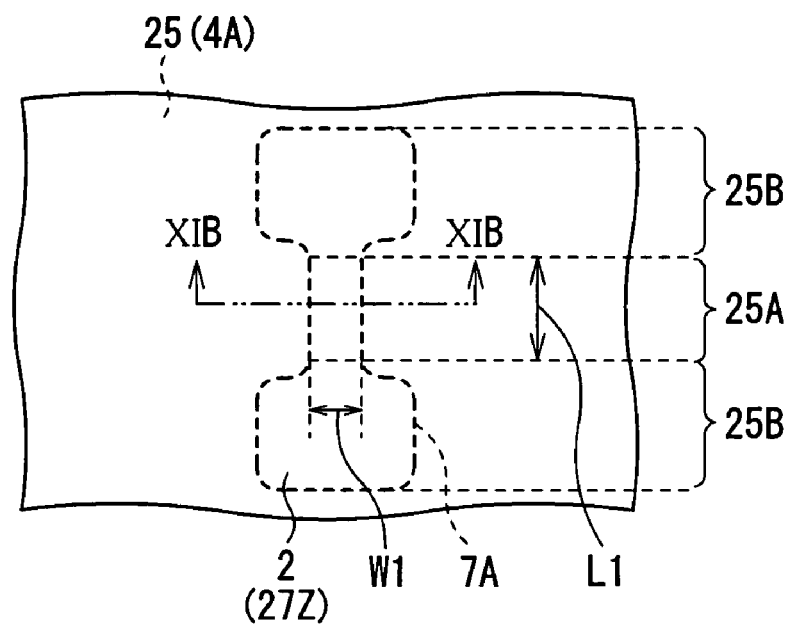
FIGS. 11A and 11B are plan view and cross section, respectively, showing a process subsequent to FIGS. 10A and 10B.
Figure 11B:
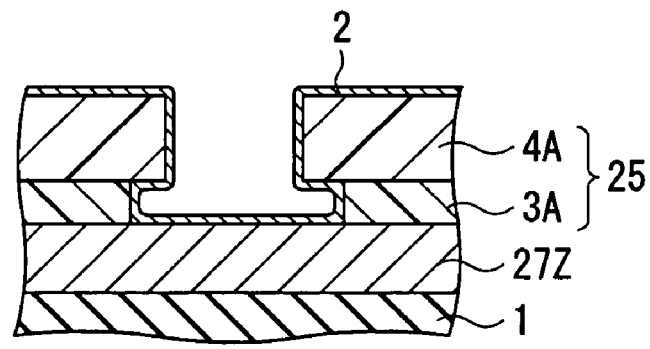

After formation of the bilayer resist pattern 25, as shown in FIGS. 11A and 11B, the soluble layer 2 is formed by using, for example, sputtering so as to cover the whole face. In this case, the soluble layer 2 is formed by using nickel iron alloy (NiFe) as the material so as to have a thickness of 0.5 nm.

Figure 12:
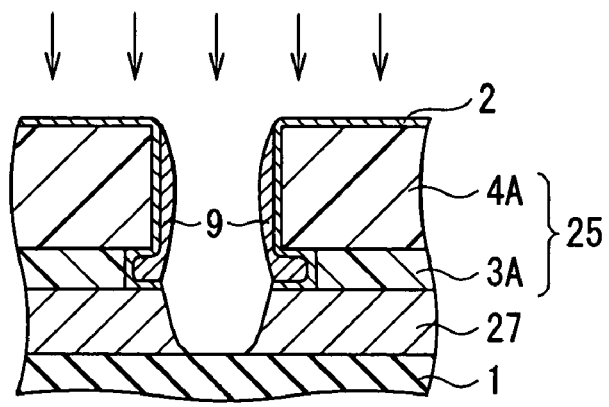
FIG. 12 is a cross section showing a process subsequent to FIGS. 11A and 11B.

After formation of the soluble layer 2, as shown in FIG. 12, the first thin film 27Z and the soluble layer 2 are selectively etched by using the bilayer resist pattern 25 as a mask by dry etching, thereby forming the first thin film pattern 27 having the opening of the same shape as that of the bilayer resist pattern 25 and the soluble layer 2. At the time of the etching operation, part of the first thin film 27Z removed once from the substrate 1 and spread is re-attached as the re-deposit 9 to the end face of the bilayer resist pattern 25 and the end face of the soluble layer 2.

Figure 13:
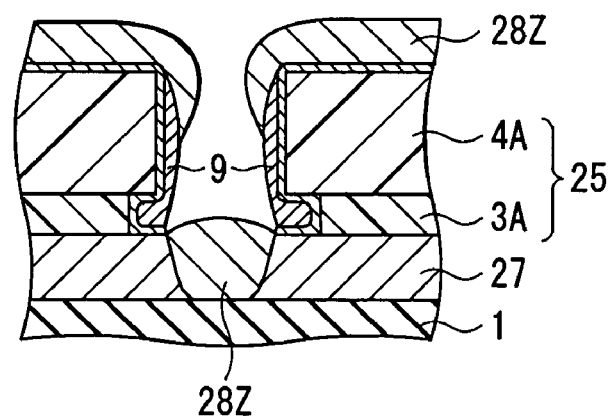
FIG. 13 is a cross section showing a process subsequent to FIG. 12.
Figure 14:
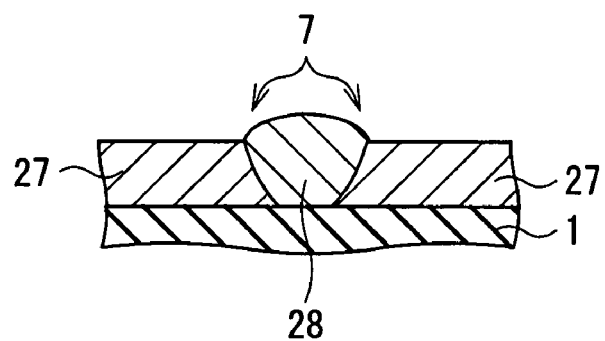
FIG. 14 is a cross section showing a process subsequent to FIG. 13.

Further, as shown in FIG. 13, a second thin film 28Z is formed by sputtering or the like so as to cover the substrate 1 exposed by the etching and the bilayer resist pattern 25 covered with the soluble layer 2. Finally, the bilayer resist pattern 25 covered with the second thin film 28Z is removed by lift-off operation. By using a predetermined solvent capable of dissolving both the bilayer resist pattern 25 and the soluble layer 2, for example, a mixed organic solvent of aromatic hydrocarbon (60 wt %), phenol (20 wt %), and octyl benzenesulfonic acid (20 wt %) held at 90° C., the bilayer resist pattern 25 and the soluble layer 2 are dissolved and removed by a single operation. By the operation, as shown in FIG. 14, a thin film pattern which has the first thin film pattern 27 having an opening defined by the contour 7 and the second thin film pattern 28 formed so as to bury the opening in the first thin film pattern 27 is completed.

As described above, according to the modification, the soluble layer 2 generally and continuously covering both of the periphery of the bilayer resist pattern 25 and the first thin film 27Z in the area other than the area covered with the bilayer resist pattern 25 is formed. Consequently, at the time of dry etching, deformation of the shape of the bilayer resist pattern 25 can be suppressed and a deposition amount of the re-deposit 9 can be also reduced. Thus, the first thin film pattern 27 having an opening defined by the contour 7 can be formed at higher precision. Further, the first thin film pattern 27 is formed by dry etching and, after that, the bilayer resist pattern 25 covered with the soluble layer 2 is removed by using a solvent which can dissolve both the bilayer resist pattern 25 and the soluble layer 2. Therefore, the first thin film pattern 27 and the bilayer resist pattern 25 can be separated from each other without a hitch. Moreover, since both of the bilayer resist pattern 25 and the soluble layer 2 are dissolved and removed by a single operation, as compared with the case of performing removing operations with different solvents, the process can be simplified. The shape of the opening in the first thin film pattern 27 is not limited to the shape defined by the contour 7 shown in FIG. 9A but may be just a rectangular shape, a circular shape, or an elongated band shape. Also in the case of any of the other shapes, the effects are obtained.

Second Embodiment

Next, by referring to FIGS. 15A and 15B to FIG. 18, a thin film pattern forming method according to a second embodiment of the invention will be described hereinbelow.

In the first embodiment, as shown in FIGS. 5A and 5B, the soluble layer 2 as a protection layer is formed so as to continuously and generally cover both of the bilayer resist pattern 5 and the first thin film 17Z in the area other than the area covered with the bilayer resist pattern 5. In contrast, in the second embodiment, a protection layer is formed so as to cover at least the portion except for the undercut portion 8 in the bilayer resist pattern 5.

Concretely, a method of forming first and second thin film patterns of the embodiment includes: a step of forming the first thin film 17Z on a substrate; a step of forming the bilayer resist pattern 5 selectively covering the first thin film 17Z; a step of forming the undercut 8 in the bilayer resist pattern 5 and, after that, forming a protection layer 22 so as to cover at least the portion other than the undercut 8; a step of selectively removing the thirst thin film 17Z by dry etching using the bilayer resist pattern 5 covered with the protection layer 22 as a mask, thereby forming the first thin film pattern 17; and a step of removing the bilayer resist pattern 5 by using a solvent which can dissolve the bilayer resist pattern 5. Each of the steps will be described in detail below. Since the steps corresponding to FIGS. 2 to 4 described in the first embodiment are substantially the same as those of the second embodiment, the description will not be repeated. The same reference numerals are designated to components which are substantially the same and their description will not be repeated.

Figure 15A:
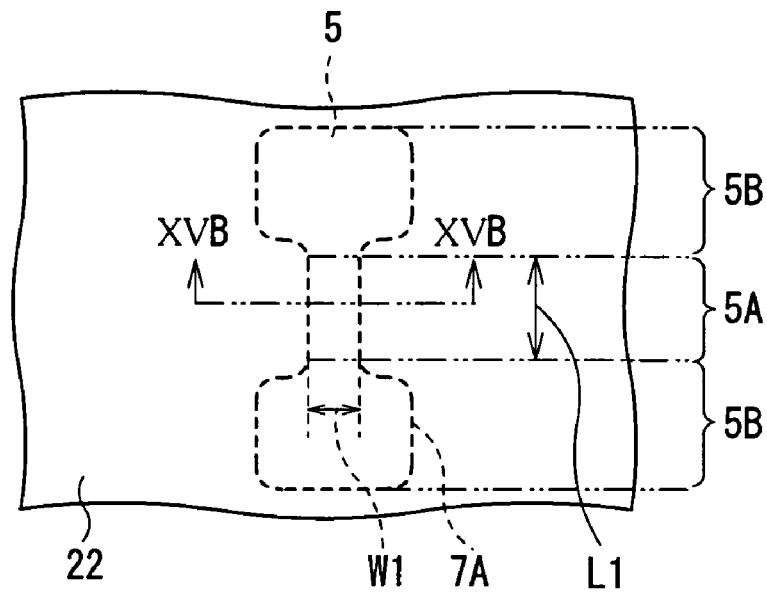
FIGS. 15A and 15B are front view and cross section, respectively, showing a thin film pattern formed by a thin film pattern forming method according to a second embodiment of the invention.
Figure 15B:
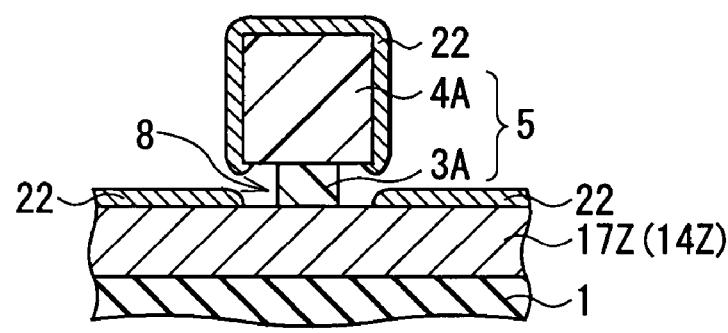

After forming the bilayer resist pattern 5 having the undercut portion 8, as shown in FIGS. 15A and 15B, the protection layer 22 is formed so as to cover the portion except for the undercut portion 8 in the bilayer resist pattern 5 and the first thin film 17Z in the area other than the area covered with the bilayer resist pattern 5. In this case, the protection layer 22 can be formed by using, as the material, a metal such as tantalum (Ta), copper (Cu), nickel (Ni), or tungsten (W), an oxide such as silicon dioxide ($SiO_2$), or aluminum oxide ($Al_2O_3$), or an organic material such as DLC.

Figure 16:
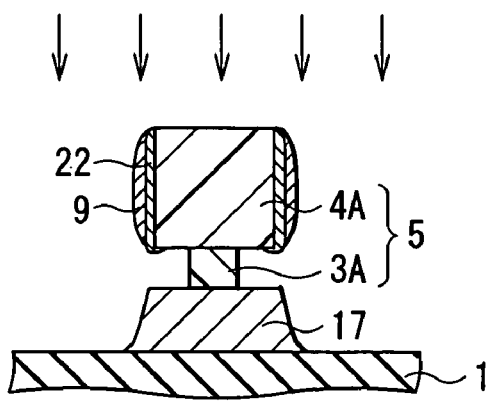
FIG. 16 is a cross section showing a process in the method of forming the thin film pattern illustrated in FIGS. 15A and 15B.

After formation of the protection layer 22, as shown in FIG. 16, the first thin film 17Z is selectively etched by using the bilayer resist pattern 5 covered with the protection layer 22 as a mask by dry etching such as ion milling or reactive ion etching, thereby forming the isolated first thin film pattern 17 having the same island shape as that of the bilayer resist pattern 5. At the time of the etching operation, part of the first thin film 17Z removed once from the substrate 1 and spread is re-attached as a re-deposit 9 to the end face of the bilayer resist pattern 5 via the protection layer 22. Further, the soluble layer 2 formed on the top face of the bilayer resist pattern 5 is partly or entirely removed by the etching operation. By the protection layer 22, in a manner similar to the first embodiment, occurrence of deformation of the shape of the bilayer resist pattern 5 due to heat of the dry etching or the like can be suppressed and deposition of the re-deposit 9 can be reduced.

Figure 17:
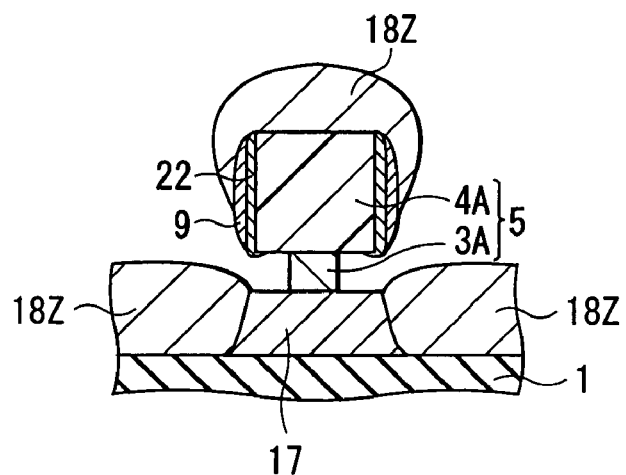
FIG. 17 is a cross section showing a process subsequent to FIG. 16.
Figure 18:
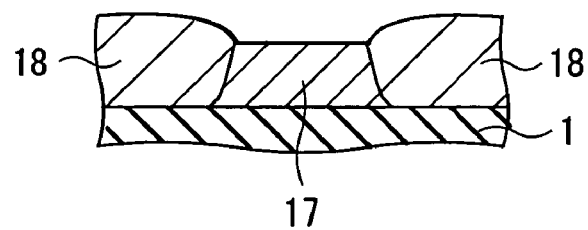
FIG. 18 is a cross section showing a process subsequent to FIG. 17.

After that, as shown in FIG. 17, the second thin film 18Z is formed by sputtering or the like by using, for example, gold (Au) as the material so as to cover the substrate 1 exposed by the etching and the bilayer resist pattern 5. Finally, the bilayer resist pattern 5 covered with the second thin film 18Z is removed by lift-off operation. In this case, a predetermined solvent capable of dissolving the bilayer resist pattern 5, for example, an organic solvent such as N-methyl pyrrolidone held at 50° C. is used. Even in the case of using the protection layer 22 which is hard to be dissolved and removed by the organic solvent or other solvents, the lift-off operation is not hindered because the protection layer 22 is not formed in the undercut portion. By the operation, as shown in FIG. 18, a thin film pattern which has the isolated first thin film pattern 17 having an island shape defined by the contour 7 and the second thin film pattern 18 surrounding the first thin film pattern 17 and disposed adjacent to the periphery of the first thin film pattern 17 is completed.

As described above, according to the embodiment, the protection layer 22 is formed so as to cover the periphery of the portion except for the undercut portion, in the bilayer resist pattern 5 and the first thin film 17Z in the area other than the area covered with the bilayer resist pattern 5. Consequently, at the time of dry etching, deformation of the shape of the bilayer resist pattern 5 can be suppressed and a deposition amount of the re-deposit 9 can be also reduced. Thus, in a manner similar to the first embodiment, the isolated first thin film pattern 17 having small dimensions and defined by the contour 7 can be formed at higher precision. Further, the protection layer 22 is not formed in the undercut portion 8 in the bilayer resist pattern 5. Consequently, also in the case where the protection layer 22 is formed by a material which is not dissolved in a solvent capable of dissolving the bilayer resist pattern 5, the first thin film pattern 17 and the bilayer resist pattern 5 can be separated from each other without a hitch. Also in the thin film pattern forming method of the second embodiment, in a manner similar to the modification of the first embodiment, by using a resist pattern having an opening, a thin film pattern having an opening whose shape is the same as the opening in the resist pattern can be formed.

Third Embodiment

By mainly referring to FIGS. 19 to 24, a method of forming a magnetoresistive element (hereinbelow, called MR element) as a third embodiment of the invent ion will be described.

First, with reference to FIGS. 19 to 21, the configuration of a thin film magnetic head having an MR element formed by the MR element forming method according to the third embodiment will be described.

Figure 19:
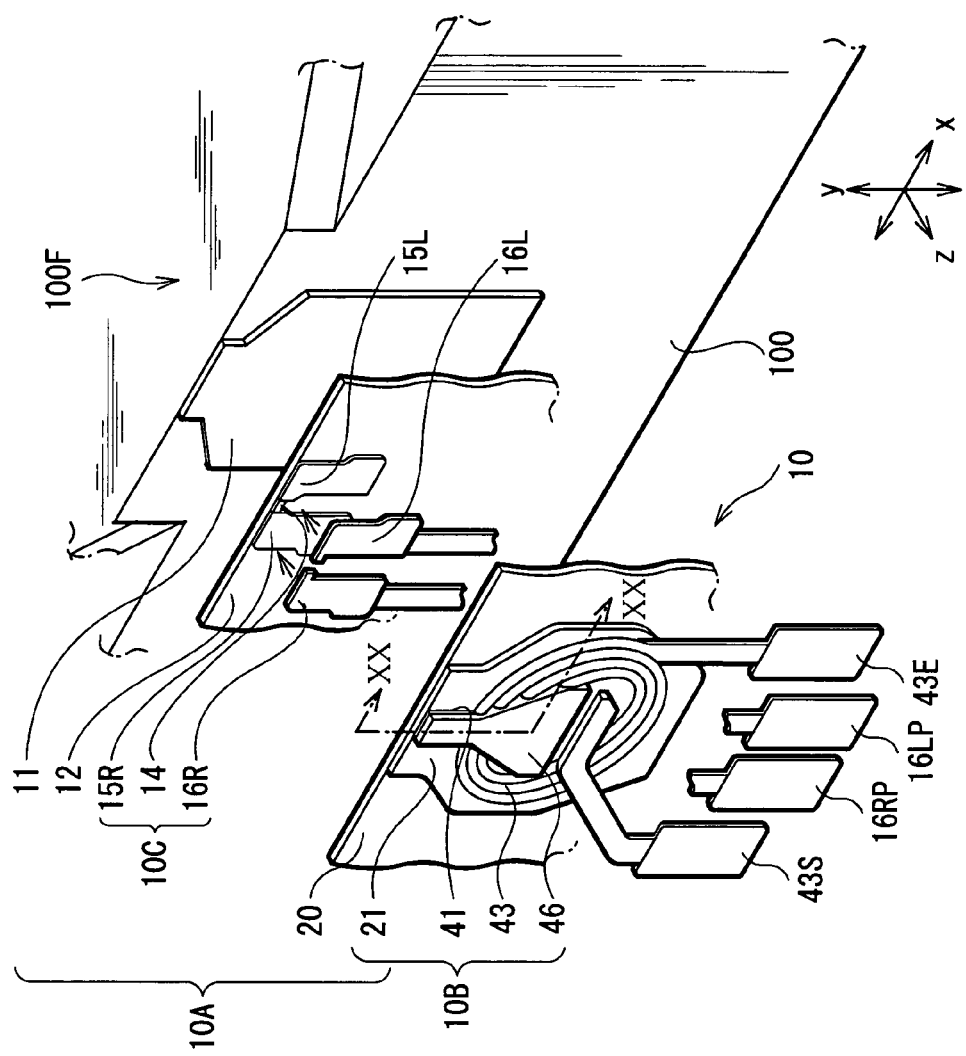
FIG. 19 is an exploded perspective view showing the configuration of a thin film magnetic head including a magnetoresistive element formed by a method of forming a magnetoresistive element according to a third embodiment of the invention.

FIG. 19 is an exploded perspective view showing the structure of a thin film magnetic head 10 formed in a side face of a slider in a magnetic head device. FIG. 20 is a cross section showing the structure taken along line XX-XX of FIG. 19. FIG. 21 is a cross section taken along line XXI-XXI of FIG. 20.

Figure 20:
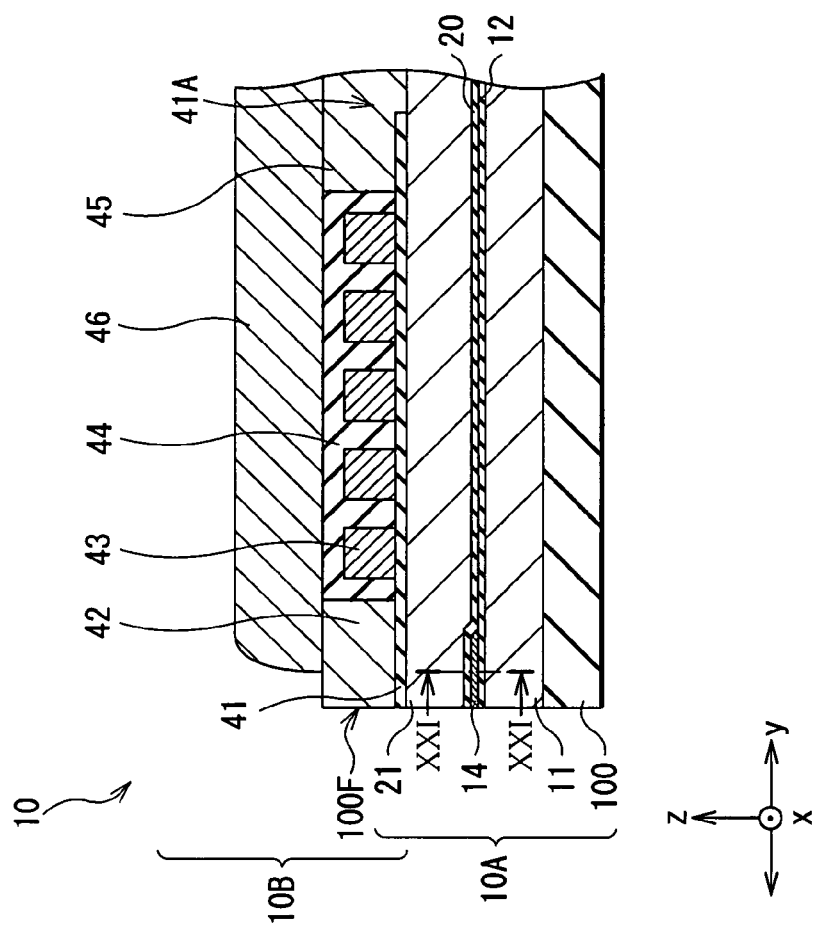
FIG. 20 is a cross section showing a structure taken along line XX-XX of the thin film magnetic head illustrated in FIG. 19.

As shown in FIGS. 19 and 20, the thin film magnetic head 10 is constructed by integrally stacking a reproducing head part 10A and a recording head part 10B in order on a substrate 100 of the slider. The reproducing head part 10A is to reproduce magnetic information recorded on a magnetic recording medium (not shown) and the recording head part 10B is to record magnetic information to a recording track in the magnetic recording medium.

Figure 21:
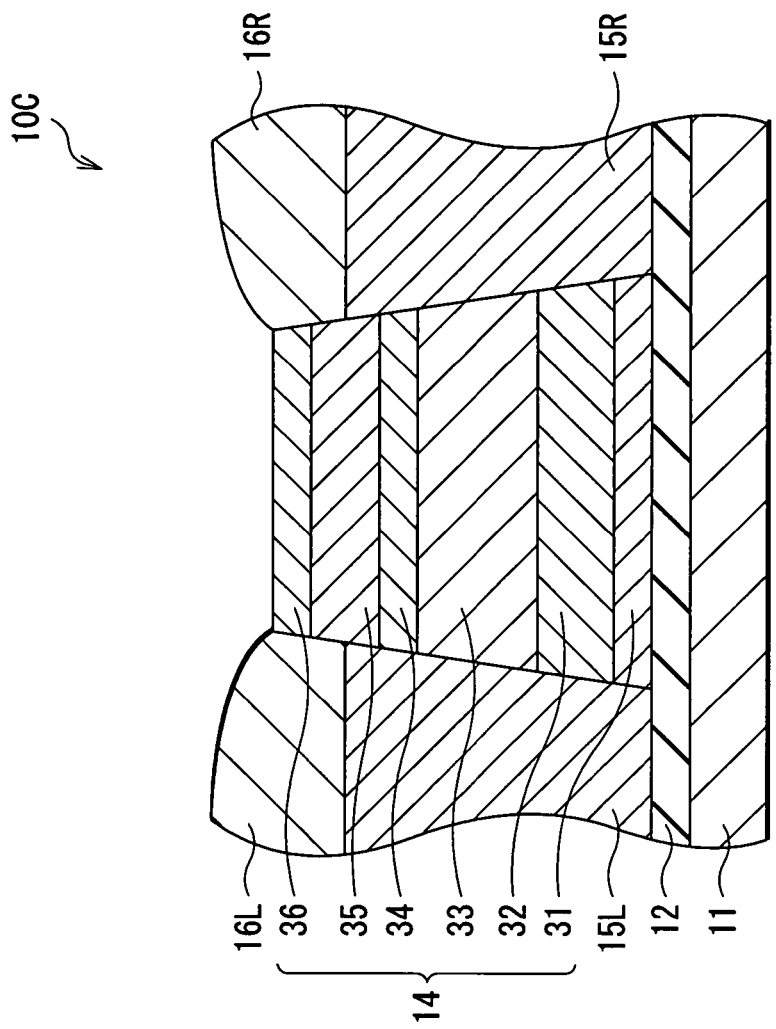
FIG. 21 is a cross section showing a structure taken along line XXI-XXI of FIG. 20 of the thin film magnetic head illustrated in FIG. 19.

As shown in FIGS. 19 and 21, the reproducing head part 10A has a structure in which, on the side of exposing in an air bearing surface 100F facing a recording face of a magnetic recording medium, for example, a lower shield layer 11, a lower gap layer 12, an MR element 10C, an upper gap layer 20, and an upper shield layer 21 are sequentially stacked on the substrate 100.

The MR element 10C includes a magnetoresistive film pattern (hereinbelow, called MR film pattern) 14, a pair of magnetic domain control layers 15R and 15L extending on both sides of the MR film pattern 14, and a pair of conductive lead layers 16R and 16L formed on the pair of magnetic domain control layers 15R and 15L, respectively. The MR film pattern 14 has, as shown in FIG. 21, a spin valve structure in which an under layer 31, a pinning layer 32, a pinned layer 33, a nonmagnetic layer 34, a magneto-sensitive layer (magnetic free layer) 35, and a protection layer 36 are sequentially stacked on the lower gap layer 12. The MR film pattern 14 functions as a sensor part for reading information recorded on a magnetic recording medium. The pair of magnetic domain control layers 15R and 15L and the pair of conductive lead layers 16R and 16L are disposed so as to face other over the MR film pattern 14 in the direction (X direction) corresponding to a recording track width direction of a magnetic recording medium. The magnetic domain control layers 15R and 15L are made of a hard magnetic material including cobalt platinum alloy (CoPt) or the like and function to suppress occurrence of Barkhausen noise by aligning the orientations of magnetic domains of the magneto-sensitive layer 35 included in the MR film pattern 14 to obtain a single magnetic domain. The conductive lead layers 16R and 16L are made of, for example, copper (Cu) or the like and function as current paths for passing sensing current in the direction (X direction) orthogonal to the stacking direction to the MR film pattern 14.

As shown in FIG. 19, the conductive lead layers 16R and 16L are connected to electrodes 16RP and 16LP, respectively.

In the reproducing head part 10A having such a configuration, the magnetization direction of the magneto-sensitive layer 35 in the MR film pattern 14 changes according to a signal magnetic field from a magnetic recording medium. Consequently, a relative change occurs between the magnetization direction of the magneto-sensitive layer 35 and the magnetization direction of the pinned layer 33 included in the MR film pattern 14 occurs. When sensing current is passed into the MR film pattern 14 via the pair of conductive lead layers 16R and 16L, the change in the magnetization direction appears as a change in electric resistance. By using the phenomenon, a signal magnetic field is detected and magnetic information is reproduced.

As shown in FIGS. 19 and 20, the recording head part 10B has the upper shield layer 21 also functioning as a bottom magnetic pole, a recording gap layer 41, a pole tip 42, a coil 43, an insulating layer 44, a coupling part 45, and a top magnetic pole 46. The recording head part 10B having such a configuration generates a magnetic flux into a magnetic path constructed by including the upper shield layer 21 and the top magnetic pole 46 by current flowing in the coil 43 and magnetizes a magnetic recording medium by a signal magnetic field generated around the recording gap layer 41 to record information.

A method of forming the MR element 10C according to the embodiment will now be described with reference to FIGS. 2 to 5 and FIGS. 22 to 24.

The method of forming the MR element 10C of the embodiment includes: a pre-step of forming the MR film pattern 14 on a substrate; and a post-step of forming a pair of thin film patterns constructed by the pair of magnetic domain control layers 15R and 15L and the pair of conductive lead layers 16R and 16L so as to be adjacent to the both ends of the MR film pattern 14. The pre-step includes: a step of an MR film which will become the MR film pattern 14 later on the substrate; a step of forming a resist pattern selectively covering the MR film; a step of forming a soluble layer so as to generally and continuously cover the resist pattern and the MR film; and a step of forming the MR film pattern 14 by selectively removing the MR film by dry etching using the resist pattern covered with the soluble layer as a mask. The post-step includes: a step of forming a metal film including at least a ferromagnetic film so as to cover the resist pattern and the area from which the MR film is removed; and a step of dissolving and removing the resist pattern and the soluble layer by a single operation by using a solvent which can dissolve both the resist pattern and the soluble layer, thereby forming a pair of thin film patterns including the pair of magnetic domain control layers 15R and 15L on both sides of the MR film pattern 14. The step of forming the thin film includes a step of forming a conductive film on the ferromagnetic film and each of a pair of thin film patterns includes a conductive lead layer. The details will be described below.

First, as shown in FIG. 2, an MR film 14Z is formed on the whole face of the substrate 1 obtained by sequentially forming the lower shield layer 11 and the lower gap layer 12 on the substrate 100 made of altic ($Al_2O_3 \cdot TiC$) or the like. Concretely, the MR film 14Z having a thickness of, for example, 50 nm is formed by sequentially stacking the under layer 31, pinning layer 32, pinned layer 33, nonmagnetic layer 34, magneto-sensitive layer 35, and protection layer 36 by using sputtering or the like.

Next, the lower resist layer 3 and the upper resist layer 4 are sequentially stacked so as to cover the whole face of the MR film 14Z by using, for example, spin coating. Further, by performing photolithography process on the lower resist layer 3 and the upper resist layer 4, the bilayer resist pattern 5 is formed. Concretely, first, as shown in FIG. 3, the lower and upper resist layers 3 and 4 are selectively exposed to light via the photo mask 6, thereby forming the latent image portion 4E. The photo mask 6 has the opening 6E having a predetermined shape. After that, for example, heating process is performed for 60 seconds in the atmosphere of 120° C., further, development is performed by dissolving and removing the latent image portion 4E by using a predetermined developer, and washing and drying is performed. In such a manner, as shown in FIGS. 4A and 4B, the isolated bilayer resist pattern 5 constructed by the lower layer portion 3A and the upper layer portion 4A and having an island shape defined by the contour 7A is formed. As shown in FIG. 4A, for example, the bilayer resist pattern 5 includes the first area 5A having dimensions (width W1 and length L1) corresponding to the MR film pattern 14 to be formed and the pair of second areas 5B adjacent to both ends of the first area 5A and each having an almost square shape.

Next, the soluble layer 2 is formed by using, for example, sputtering so as to generally and continuously cover both of the bilayer resist pattern 5 and the MR film 14Z. In this case, the soluble layer 2 is formed by using a water soluble resin such as polyvinyl alcohol as the material so as to have a thickness of 2 nm. In place of polyvinyl alcohol, diamond-like carbon (DLC) may be used as the material.

Figure 22:
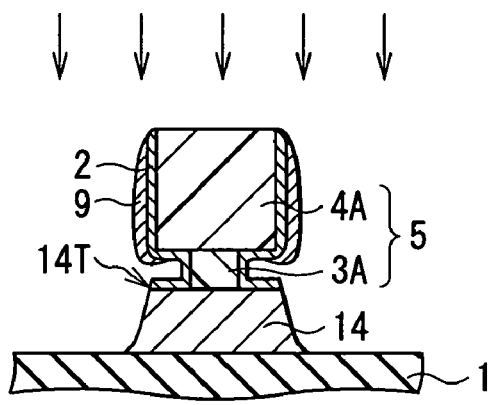
FIG. 22 is a cross section showing a process in a method of forming the magnetoresistive element illustrated in FIG. 19.

After formation of the bilayer resist pattern 5, as shown in FIG. 22, the MR film 14Z is selectively etched by using the bilayer resist pattern 5 as a mask by dry etching, thereby forming the MR film pattern 14. In this case, the dry etching is performed in a state where the soluble layer 2 covers the MR film 14Z, so that occurrence of deformation of the shape of the end 14T of the MR film pattern 14 to be patterned is suppressed. Consequently, the MR film pattern 14 is defined more accurately in correspondence with the contour of the bilayer resist pattern 5. At the time of the etching operation, part of the MR film 14Z removed once from the substrate 1 and spread is re-attached as a re-deposit 9 to the end face of the bilayer resist pattern 5 and the end face of the soluble layer 2. The operations of the pre-step are completed.

Figure 23:
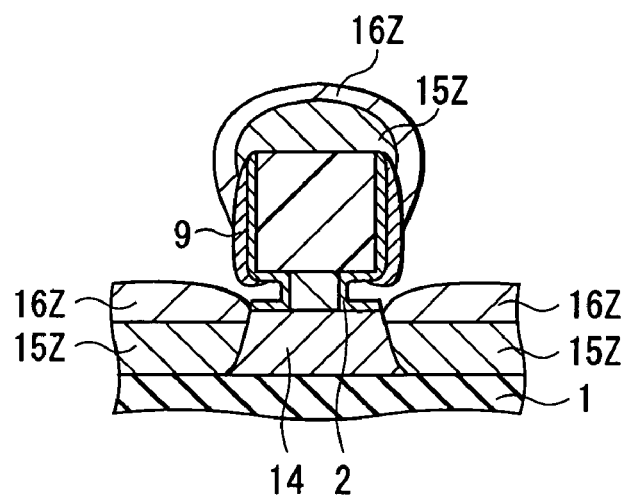
FIG. 23 is a cross section showing a process subsequent to FIG. 22.
Figure 24:
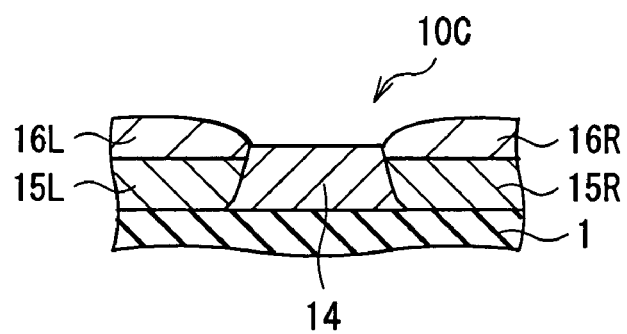
FIG. 24 is a cross section showing a process subsequent to FIG. 23.

After that, as shown in FIG. 23, a ferromagnetic film 15Z and a conductive film 16Z are sequentially stacked so as to cover the substrate 1 exposed by etching and the bilayer resist pattern 5. The ferromagnetic film 15Z and the conductive film 16Z are a concrete example corresponding to a "metal film" in the invention. Finally, the bilayer resist pattern 5 covered with the ferromagnetic film 15Z and the conductive film 16Z is removed by lift-off operation. By using a predetermined solvent capable of dissolving both the bilayer resist pattern 5 and the soluble layer 2, for example, an organic solvent such as N-methyl pyrrolidone held at 50° C., the bilayer resist pattern 5 and the soluble layer 2 are dissolved and removed by a single operation, and the operations of the post-step are finished. As shown in FIG. 24, the MR element 10C having the MR film pattern 14 and the pair of magnetic domain control layers 15R and 15L and the pair of conductive lead layers 16R and 16L disposed so as to face each other and adjacent to both ends of the MR film pattern 14 is completed.

As described above, according to the third embodiment, the soluble layer 2 is formed so as to generally and continuously cover the MR film 14Z and the bilayer resist pattern 5. Consequently, at the time of selectively removing the MR film 14Z and the soluble layer 2 by dry etching using the bilayer resist pattern 5 as a mask, occurrence of deformation of the shape of the bilayer resist pattern 5 can be suppressed and etching can be performed more accurately. Further, the bilayer resist pattern 5 and the soluble layer 2 are dissolved and removed by a single operation by using a solvent which can dissolve both the bilayer resist pattern 5 and the soluble layer 2, so that the MR film pattern 14 and the bilayer resist pattern 5 can be separated from each other without a hitch. Therefore, the MR element 10C including the MR film pattern 14 having small dimensions can be formed at higher precision.

Fourth Embodiment

By referring to FIGS. 25A and 25B to FIG. 31, a thin film pattern forming method according to a fourth embodiment of the invention will be described hereinbelow.

Figure 25A:
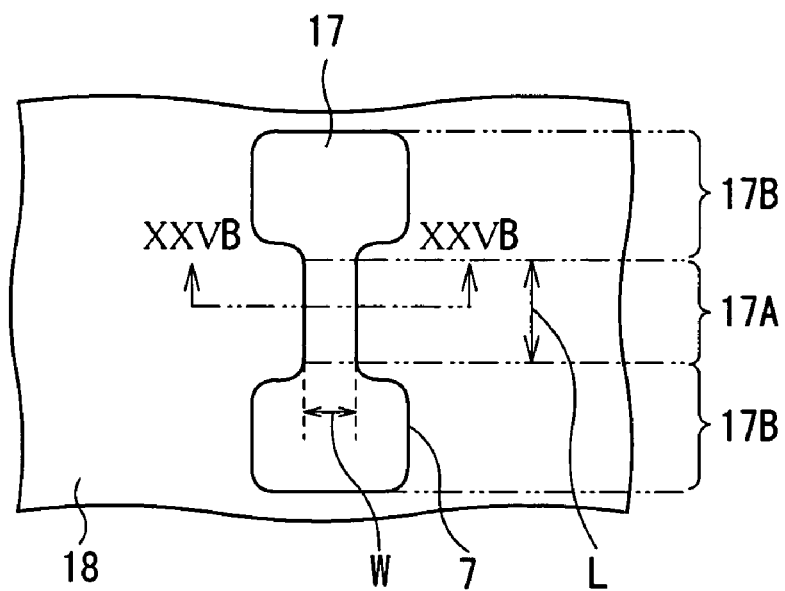
FIGS. 25A and 25B are plan view and cross section, respectively, showing a thin film pattern formed by a method of forming a thin film pattern according to a fourth embodiment of the invention.
Figure 25B:
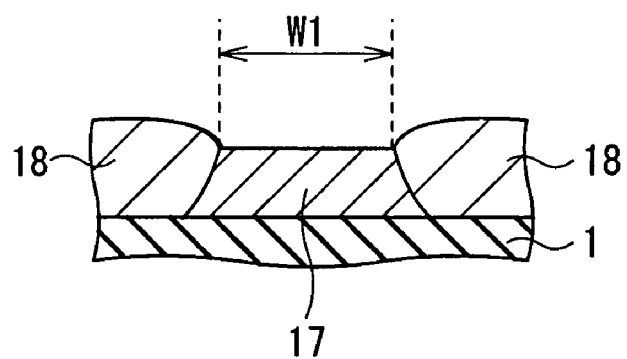

FIGS. 25A and 25B show the first thin film pattern 17 formed on the substrate 1 in which a predetermined function film is formed as necessary on a substrate made of altic ($Al_2O_3$.TiC) or the like and having an island pattern shape defined by the contour 7, and the second thin film pattern 18 covering the periphery of the first thin film pattern 17. FIG. 25A shows a plane configuration and FIG. 25B shows a sectional configuration taken along line XXVA-XXVA of FIG. 25A.

The first thin film pattern 17 has a plane shape constructed by, as shown in FIG. 25A, for example, the first area 17A having small width W (for example, 0.18 μm) and length L (for example, 3 μm), and the pair of second areas 17B adjacent to both ends of the first area 17A and each having an almost square shape. The material of the first and second thin film patterns 17 and 18 may be, for example, a conductive material or an insulating material. Alternately, it may be a magnetic material or a non-magnetic material. The structure of the first and second thin film patterns 17 and 18 may be a single-layer structure or a stacked structure in which a plurality of layers are stacked.

A method of forming the first and second thin film patterns 17 and 18 includes: a step of forming a first thin film which will become the first thin film pattern 17 later on the substrate 1; a step of forming a soluble layer on the first thin film; a step of forming a resist pattern on the soluble layer; a step of forming a first thin film pattern and a soluble layer pattern by selectively removing the first thin film and the soluble layer by dry etching using the resist pattern as a mask; a step of forming a second thin film so as to cover the resist pattern and the area from which the first thin film and the soluble layer are removed; and a step of dissolving and removing the resist pattern and the soluble layer pattern by using a solvent which can dissolve both the resist pattern and the soluble layer pattern. Each of the steps will be described in detail below.

Figure 26:
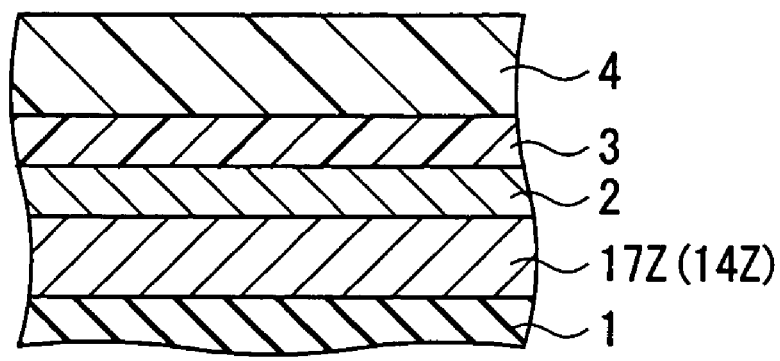
FIG. 26 is a cross section showing a process in the method of forming the thin film pattern illustrated in FIG. 25.

First, as shown in FIG. 26, the first thin film 17Z which will become the first thin film pattern 17 obtained finally is formed on the whole face of the substrate 1 by sputtering using, for example, tantalum (Ta) as the component material.

Next, the soluble layer 2 is formed by using, for example, sputtering so as to cover the whole face of the first thin film 17Z. In this case, copper (Cu) is used as the material and the soluble layer 2 is formed so as to have a thickness of, for example, 0.5 nm. Subsequently, the lower resist layer 3 and the upper resist layer 4 are sequentially stacked by using, for example, spin coating so as to cover the whole face of the soluble layer 2. In this case, for example, a resist material whose main component is polymethylglutarimide (PMGI) as an alkali soluble resin is applied and heating process is performed as necessary, thereby forming the lower resist layer 3 so as to have a thickness of about 50 nm. After that, for example, a positive resist material whose main component is polyhydroxy styrene is applied and heating process is performed as necessary, thereby forming the upper resist layer 4 so as to have a thickness of about 0.5 µm.

Figure 27:
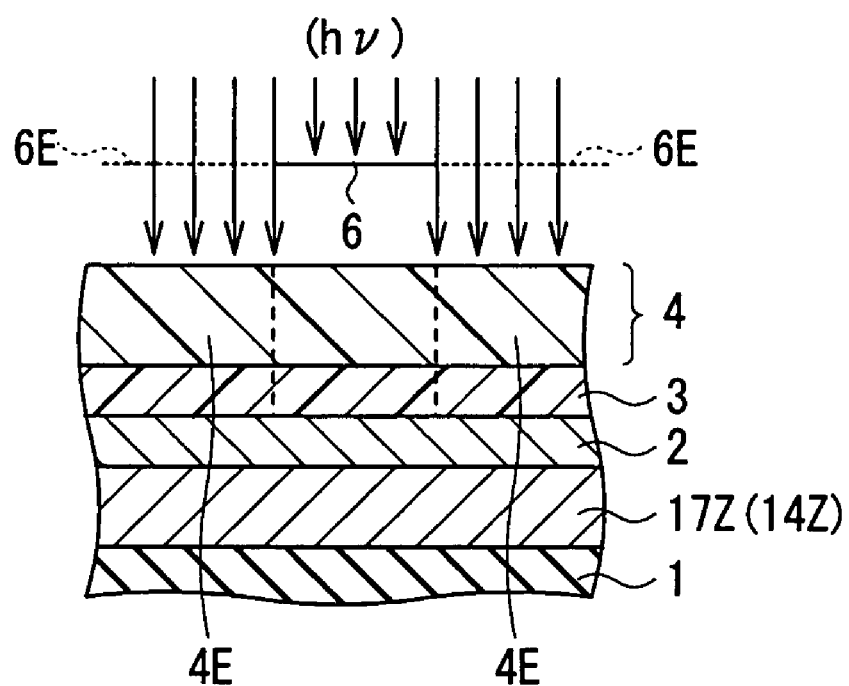
FIG. 27 is a cross section showing a process subsequent to FIG. 26.
Figure 28A:
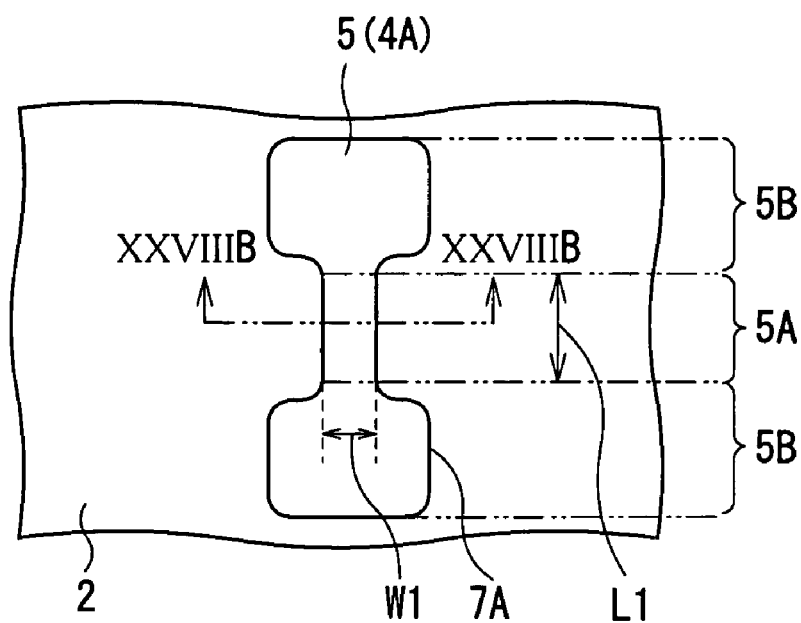
FIGS. 28A and 28B are plan view and cross section, respectively, showing a process subsequent to FIG. 27.
Figure 28B:
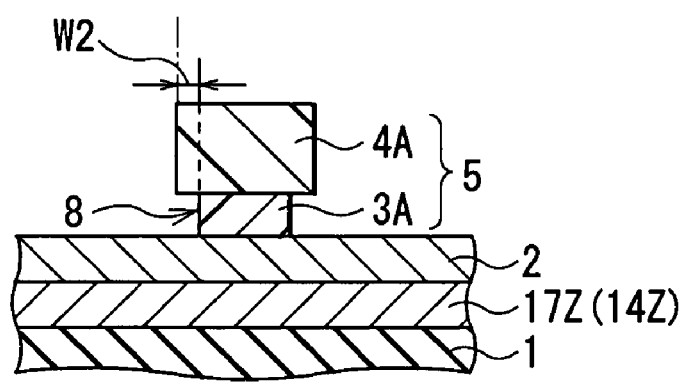

Subsequently, by performing photolithography process on the lower resist layer 3 and the upper resist layer 4, the bilayer resist pattern 5 is formed. Concretely, first, as shown in FIG. 27, by selectively exposing the lower and upper resist layers 3 and 4 to light via the photo mask 6 having openings 6E each having a predetermined shape, the latent image portion 4E is formed. After that, for example, heating process is performed for 60 seconds in the atmosphere of 120° C., further, development is performed by dissolving and removing part of the latent image portion 4E and part of the lower resist layer 3 by using a predetermined developer (for example, tetramethyl ammonium hydroxide aqueous solution), and washing and drying is performed. In such a manner, as shown in FIGS. 28A and 28B, the isolated bilayer resist pattern 5 constructed by the lower layer portion 3A and the upper layer portion 4A and having an island shape defined by the contour 7A is formed. As shown in FIG. 28A, for example, the bilayer resist pattern 5 includes the first area 5A having dimensions (width W1 and length L1) corresponding to width W and length L of the first thin film pattern 17 to be formed and a pair of second areas 5B adjacent to both ends of the first area 5A and each having an almost square shape. FIG. 28A shows a plane configuration in the process subsequent to FIG. 27, and FIG. 28B shows a sectional configuration taken along line XXVIIIB-XXVIIIB of FIG. 28A.

In this case, the alkali soluble resin is used for the lower resist layer 3 so that, by using an alkali developer, the undercut 8 as shown in FIG. 28B can be formed. The width W2 of the undercut 8 can be controlled by, for example, concentration of the developer and development time. The optimum value of the width W2 is to be determined in consideration of various conditions such as the material and thickness of the soluble layer 2 and the first thin film 14Z, the size of the bilayer resist pattern, thickness of each of the lower and upper layer portions 3A and 4A, and a method of dry etching.

Figure 29:
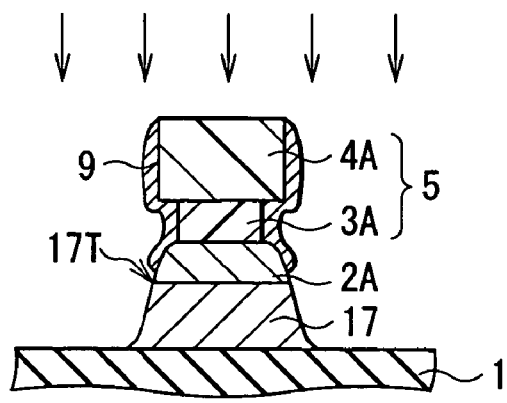
FIG. 29 is a cross section showing a process subsequent to FIG. 28.

After formation of the bilayer resist pattern 5, as shown in FIG. 29, the first thin film 17Z and the soluble layer 2 are selectively etched by using the bilayer resist pattern 5 as a mask by dry etching such as ion milling or reactive ion etching (RIE), thereby forming the isolated first thin film pattern 17 and the soluble layer pattern 2A having the same island shape as that of the bilayer resist pattern 5. Since the dry etching is performed in a state where the first thin film 17Z is covered with the soluble layer 2, occurrence of shape deformation of the end 17T of the first thin film pattern 17 to be patterned is suppressed. In the case where the soluble layer 2 is not formed, like the conventional thin film pattern 117 shown in FIG. 42, the shape of the end 117T is deformed and rounded. In contrast, in the embodiment, occurrence of deformation of the shape of the end 17T is suppressed. Thus, the first thin film pattern 17 is defined more accurately in accordance with the contour 7A of the bilayer resist pattern 5. At the time of the etching operation, part of the first thin film 17Z removed once from the substrate 1 and spread is re-attached as a re-deposit 9 to the end face of the bilayer resist pattern 5 and the end face of the soluble layer pattern 2A.

Figure 30:
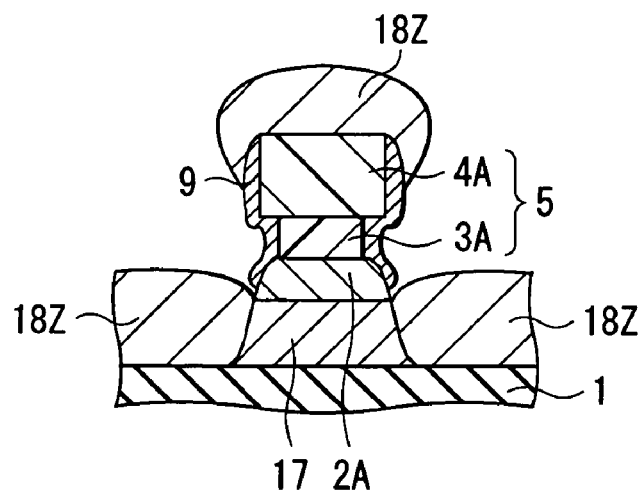
FIG. 30 is a cross section showing a process subsequent to FIG. 29.
Figure 31:
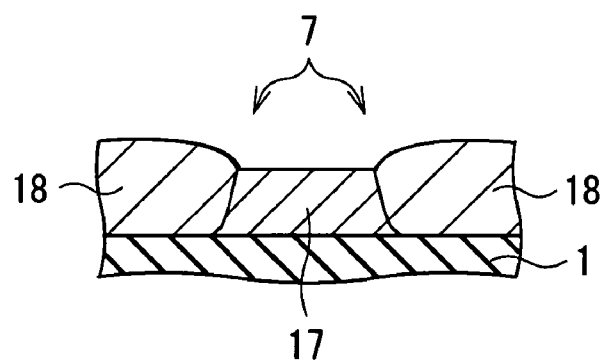
FIG. 31 is a cross section showing a process subsequent to FIG. 30.

After that, as shown in FIG. 30, the second thin film 18Z is formed by sputtering or the like by using, for example, gold (Au) as the material so as to cover the substrate 1 exposed by the etching and the bilayer resist pattern 5. Finally, the bilayer resist pattern 5 covered with the second thin film 18Z is removed by lift-off operation. By using a predetermined solvent capable of dissolving both the bilayer resist pattern 5 and the soluble layer pattern 2A, for example, an organic solvent of N-methyl pyrrolidone or the like held at 50° C., the bilayer resist pattern 5 and the soluble layer pattern 2A are dissolved and removed by a single operation. By the operation, as shown in FIG. 31, a thin film pattern which has the isolated first thin film pattern 17 having an island shape defined by the contour 7 and the second thin film pattern 18 surrounding the first thin film pattern 17 and disposed adjacent to the periphery of the first thin film pattern 17 is completed.

As described above, according to the embodiment, the soluble layer 2 made of, for example, copper is formed between the first thin film 17Z and the bilayer resist pattern 5, so that the first thin film 17Z and the bilayer resist pattern 5 are separated from each other by the soluble layer 2. Further, the first thin film 17Z and the soluble layer 2 are selectively removed by dry etching using the isolated bilayer resist pattern 5 having an island shape as a mask, so that occurrence of deformation of the shape of the end 17T of the first thin film pattern 17 can be suppressed and etching can be performed more accurately. Moreover, since both of the bilayer resist pattern 5 and the soluble layer 2 are dissolved and removed by a single operation by using a solvent capable of dissolving both of the bilayer resist pattern 5 and the soluble layer pattern 2A, without causing a burr in the first thin film pattern 17, the first thin film pattern 17 and the bilayer resist pattern 5 can be easily separated from each other. Moreover, since both of the bilayer resist pattern 5 and the soluble layer pattern 2A are dissolved and removed, as compared with the case of performing removing operations with different solvents, the process can be simplified. As described above, according to the embodiment, the isolated first thin film pattern 17 having smaller dimensions and defined by the contour 7 can be easily formed at high precision. The shape of the first thin film pattern 17 is not limited to the shape defined by the contour 7 shown in FIG. 25A but may be just a rectangular shape, a circular shape, or an elongated band shape. Also in the case of any of the other shapes, the effects are obtained.

Fifth Embodiment

Referring now to FIGS. 32A and 32B to FIG. 38, a thin film pattern forming method according to a fifth embodiment will be described hereinbelow.

In the foregoing fourth embodiment, the case of forming the isolated thin film pattern having the same shape as the isolated bilayer resist pattern having an island shape by using the isolated bilayer resist pattern has been described. In contrast, in the fifth embodiment, the case of forming a thin film pattern including an opening whose shape is the same as an opening in a resist pattern by using the resist pattern will be described.

Figure 32A:
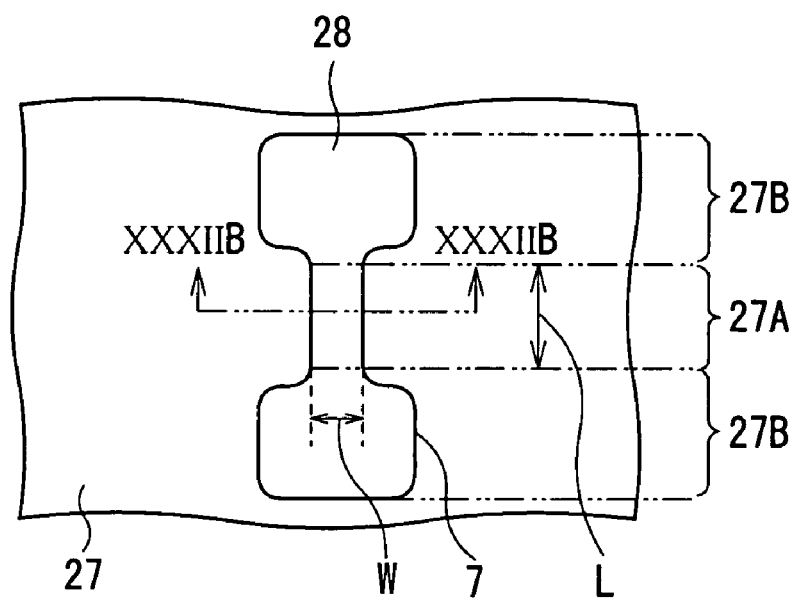
FIGS. 32A and 32B are plan view and cross section, respectively, showing a thin film pattern formed by a method of forming a thin film pattern according to a fifth embodiment of the invention.
Figure 32B:
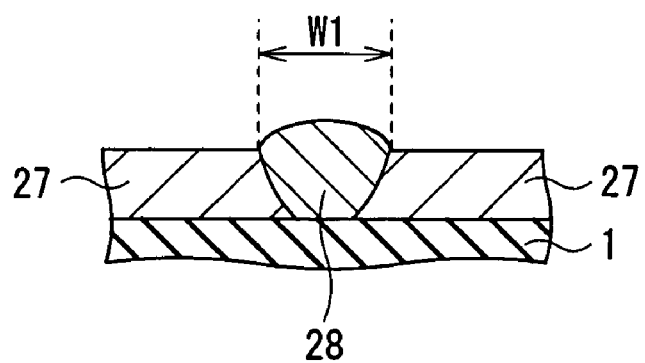

FIGS. 32A and 32B show a first thin film pattern 27 formed on the substrate 1 and having an opening defined by the contour 7 and a second thin film pattern 28 formed so as to close the opening of the first thin film pattern 27. FIG. 32A shows a plane configuration and FIG. 32B shows a sectional configuration taken along line VIIIA-VIIIA of FIG. 32A.

The opening in the first thin film pattern 27 has a plane shape constructed by, as shown in FIG. 32A, for example, the first area 27A having width W (for example, 0.18 µm) and length L (for example, 3 µm), and the pair of second areas 27B adjacent to both ends of the first area 27A and each having an almost square shape. A method of forming the first and second thin film patterns 27 and 28 shown in FIGS. 32A and 32B will be described in detail hereinbelow.

Figure 33:
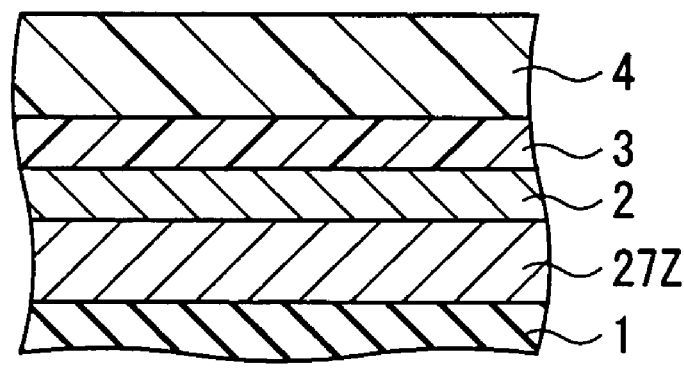
FIG. 33 is a cross section showing a process in the method of forming the thin film pattern illustrated in FIG. 32.

First, as shown in FIG. 33, the first thin film 27Z which will become the first thin film pattern 27 obtained finally is formed on the whole face of the substrate 1 by sputtering using, for example, tantalum as the component material. Next, the soluble layer 2 is formed by using, for example, sputtering so as to cover the whole face of the first thin film 27Z. In this case, the soluble layer 2 is formed so as to have a thickness of, for example, 0.5 nm by using, for example, a nickel iron alloy (NiFe) as the material. Subsequently, in a manner similar to the first embodiment, the lower resist layer 3 and the upper resist layer 4 are sequentially stacked by using, for example, spin coating so as to cover the whole face of the soluble layer 2.

Figure 34:
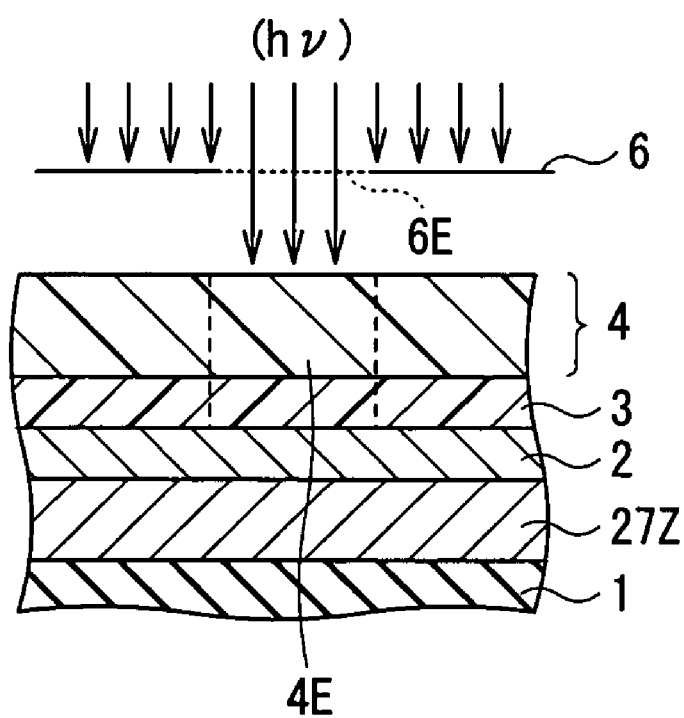
FIG. 34 is a cross section showing a process subsequent to FIG. 33.
Figure 35A:
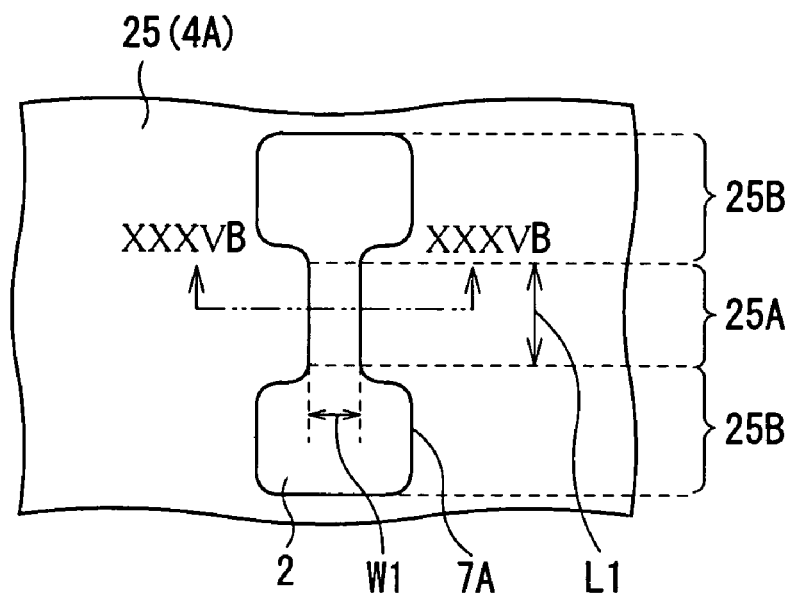
FIGS. 35A and 35B are plan view and cross section, respectively, showing a process subsequent to FIG. 34.
Figure 35B:
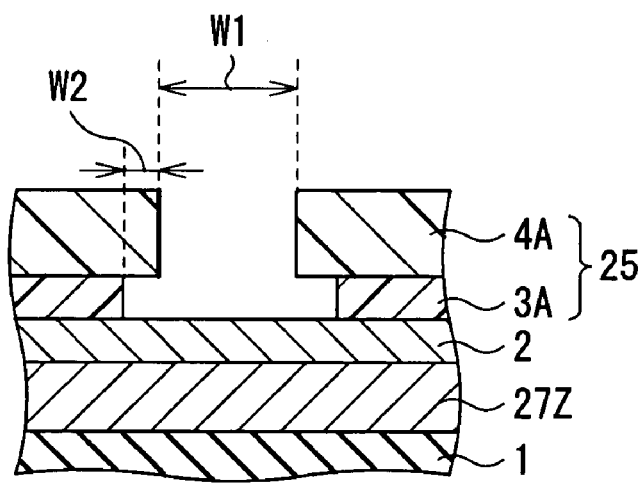

Subsequently, by performing photolithography process on the lower resist layer 3 and the upper resist layer 4, the bilayer resist pattern 5 is formed. Concretely, first, as shown in FIG. 34, by selectively exposing the lower and upper resist layers 3 and 4 to light via the photo mask 6 having the opening 6E of a predetermined shape, the latent image portion 4E is formed. After that, for example, heating process is performed for 60 seconds in the atmosphere of 120° C., further, development is performed by dissolving and removing part of the latent image portion 4E and part of the lower resist layer 3 by using a predetermined developer (for example, tetramethyl ammonium hydroxide aqueous solution) and washing and drying is performed. In such a manner, as shown in FIGS. 35A and 35B, the bilayer resist pattern 25 constructed by the lower layer portion 3A and the upper layer portion 4A and having the opening defined by the contour 7A is formed. As shown in FIG. 35A, for example, the opening of the bilayer resist pattern 25 includes the first area 25A having dimensions (width W1 and length L1) corresponding to width W and length L of the first thin film pattern 27 to be formed and the pair of second areas 25B adjacent to both ends of the first area 25A and each having an almost square shape. FIG. 35A shows a plane configuration in the process subsequent to FIG. 34, and FIG. 35B shows a sectional configuration taken along line XXXVB-XXXVB of FIG. 35A.

Figure 36:
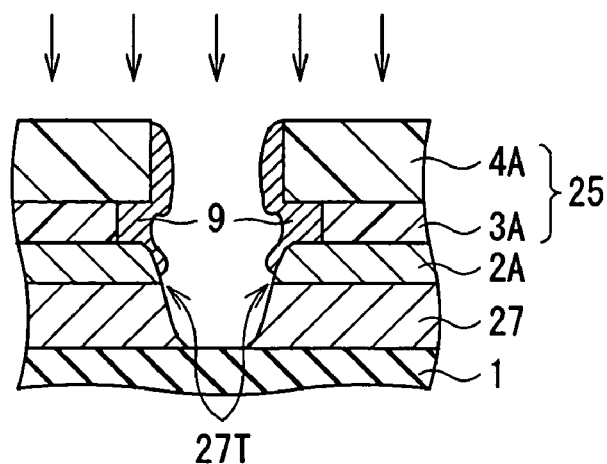
FIG. 36 is a cross section showing a process subsequent to FIG. 35.

After formation of the bilayer resist pattern 25, as shown in FIG. 36, the first thin film 27Z and the soluble layer 2 are selectively etched by using the bilayer resist pattern 25 as a mask by dry etching, thereby forming the first thin film pattern 27 having the opening of the same shape as that of the bilayer resist pattern 25 and the soluble layer pattern 2A. At the time of the etching operation, part of the first thin film 27Z removed once from the substrate 1 and spread is re-attached as the re-deposit 9 to the end face of the bilayer resist pattern 25 and the end face of the soluble layer pattern 2A.

Figure 37:
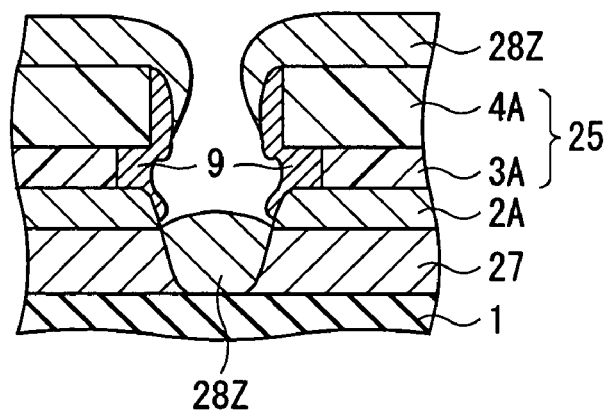
FIG. 37 is a cross section showing a process subsequent to FIG. 36.
Figure 38:
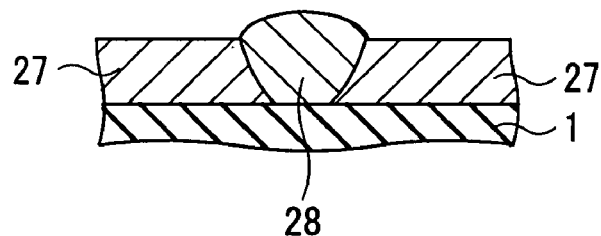
FIG. 38 is a cross section showing a process subsequent to FIG. 37.

Further, as shown in FIG. 37, the second thin film 28Z is formed by sputtering or the like so as to cover the substrate 1 exposed by the etching and the bilayer resist pattern 25. Finally, the bilayer resist pattern 25 covered with the second thin film 28Z is removed by lift-off operation. By using a predetermined solvent capable of dissolving both the bilayer resist pattern 25 and the soluble layer pattern 2A, for example, a mixed organic solvent of aromatic hydrocarbon (60 wt %), phenol (20 wt %), and octyl benzenesulfonic acid (20 wt %) held at, for example, 90° C., the bilayer resist pattern 25 and the soluble layer pattern 2A are dissolved and removed by a single operation. By the operation, as shown in FIG. 38, a thin film pattern which has the first thin film pattern 27 having an opening defined by the contour 7 and the second thin film pattern 28 formed so as to bury the opening in the first thin film pattern 27 is completed.

As described above, according to the fifth embodiment, the soluble layer 2 made of, for example, NiFe is formed between the first thin film 27Z and the bilayer resist pattern 25, so that the structure in which the first thin film 27Z and the bilayer resist pattern 25 are separated from each other by the soluble layer 2 can be obtained. Further, since the first thin film 27Z and the soluble layer 2 are selectively removed by dry etching using the bilayer resist pattern 25 having an opening as a mask, occurrence of deformation of the shape of the end 27T of the first thin film pattern 27 can be suppressed and etching can be performed more accurately. Since the bilayer resist pattern 25 and the soluble layer pattern 2A are dissolved and removed by a single operation by using a solvent which can dissolve both the bilayer resist pattern 25 and the soluble layer pattern 2A, the first thin film pattern 27 and the bilayer resist pattern 25 can be easily separated from each other without causing a burr in the first thin film pattern 27. Moreover, since both of the bilayer resist pattern 25 and the soluble layer pattern 2A are dissolved and removed by a single operation, as compared with the case of performing removing operations with different solvents, the process can be simplified. As described above, according to the fifth embodiment, the first thin film pattern 27 having smaller dimensions and having an opening defined by the contour 7 can be easily formed at higher precision. The shape of the opening in the first thin film pattern 27 is not limited to the shape defined by the contour 7 shown in FIG. 32A but may be just a rectangular shape, a circular shape, or an elongated band shape. Also in the case of any of the other shapes, the effects are obtained.

Sixth Embodiment

A method of forming a magnetoresistive element as a sixth embodiment of the invention will be described hereinbelow.

Another method of forming the MR element 10C shown in FIGS. 19 to 21 will be described with reference to FIGS. 26 to 28 and FIGS. 39 to 41.

The method of forming the MR element 10C of the embodiment includes: a pre-step of forming the MR film pattern 14 on a substrate; and a post-step of forming a pair of thin film patterns constructed by the pair of magnetic domain control layers 15R and 15L and the pair of conductive lead layers 16R and 16L so as to be adjacent to the both ends of the MR film pattern 14. The pre-step includes: a step of an MR film which will become the MR film pattern 14 later on the substrate; a step of forming a soluble layer on the MR film; a step of forming a resist pattern on the soluble layer; and a step of forming the MR film pattern 14 and the soluble layer pattern by selectively removing the MR film and the soluble layer by dry etching using the resist pattern as a mask. The post-step includes: a step of forming a thin film including at least a ferromagnetic film so as to cover the resist pattern and the area from which the MR film and the soluble layer were removed; and a step of dissolving and removing the resist pattern and the soluble layer pattern by a single operation by using a solvent which can dissolve both the resist pattern and the soluble layer, thereby forming a pair of thin film patterns including the pair of magnetic domain control layers 15R and 15L on both sides of the MR film pattern 14. The step of forming the thin film includes a step of forming a conductive film on the ferromagnetic film and each of a pair of thin film patterns includes a conductive lead layer. The details will be described below.

First, as shown in FIG. 26, the MR film 14Z is formed on the whole face of the substrate 1 obtained by sequentially forming the lower shield layer 11 and the lower gap layer 12 on the substrate 100 made of altic ($Al_2O_3$.TiC) or the like. Concretely, the MR film 14Z having a thickness of, for example, 50 nm is formed by sequentially stacking the under layer 31, pinning layer 32, pinned layer 33, nonmagnetic layer 34, magneto-sensitive layer 35, and protection layer 36 by using sputtering or the like.

Next, the soluble layer 2 is formed so as to cover the whole face of the MR film 14Z by using, for example, spin coating.

In this case, the soluble layer 2 is formed by using a water soluble resin such as polyvinyl alcohol as the material so as to have a thickness of 2 nm. In place of polyvinyl alcohol, diamond-like carbon (DLC) may be used as the material. Subsequently, the lower resist layer 3 and the upper resist layer 4 are sequentially stacked by using, for example, spin coating so as to cover the whole face of the soluble layer 2.

Further, by performing photolithography process on the lower resist layer 3 and the upper resist layer 4, the bilayer resist pattern 5 is formed. Concretely, first, as shown in FIG. 27, the lower and upper resist layers 3 and 4 are selectively exposed to light via the photo mask 6, thereby forming the latent image portion 4E. The photo mask 6 has the opening 6E having a predetermined shape. After that, for example, heating process is performed for 60 seconds in the atmosphere of 120° C., further, development is performed by dissolving and removing the latent image portion 4E by using a predetermined developer, and washing and drying is performed. In such a manner, as shown in FIGS. 28A and 28B, the isolated bilayer resist pattern 5 constructed by the lower layer portion 3A and the upper layer portion 4A and having an island shape defined by the contour 7A is formed. As shown in FIG. 28A, for example, the bilayer resist pattern 5 includes the first area 5A having dimensions (width W1 and length L1) corresponding to the MR film pattern 14 to be formed and the pair of second areas 5B adjacent to both ends of the first area 5A and each having an almost square shape.

Figure 39:
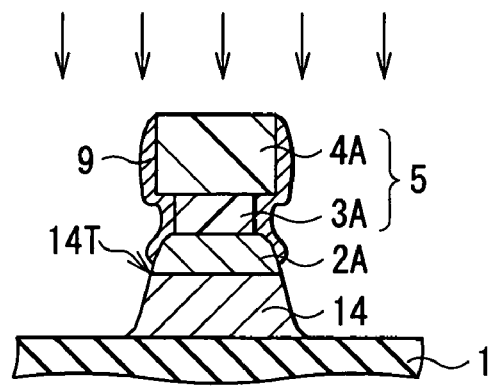
FIG. 39 is a cross section showing a process in a method of forming a magnetoresistive element according to a sixth embodiment of the invention.

After formation of the bilayer resist pattern 5, as shown in FIG. 39, the MR film 14Z and the soluble layer 2 are selectively etched by dry etching using the bilayer resist pattern 5 as a mask, thereby forming the MR film pattern 14 and the soluble layer pattern 2A. In this case, the dry etching is performed in a state where the soluble layer 2 covers the MR film 14Z, so that occurrence of deformation of the shape of the end 14T of the MR film pattern 14 to be patterned is suppressed. Consequently, the MR film pattern 14 is defined more accurately in correspondence with the contour of the bilayer resist pattern 5. At the time of the etching operation, part of the MR film 14Z removed once from the substrate 1 and spread is re-attached as a re-deposit 9 to the end face of the bilayer resist pattern 5 and the end face of the soluble layer pattern 2A. The operations of the pre-step are completed.

Figure 40:
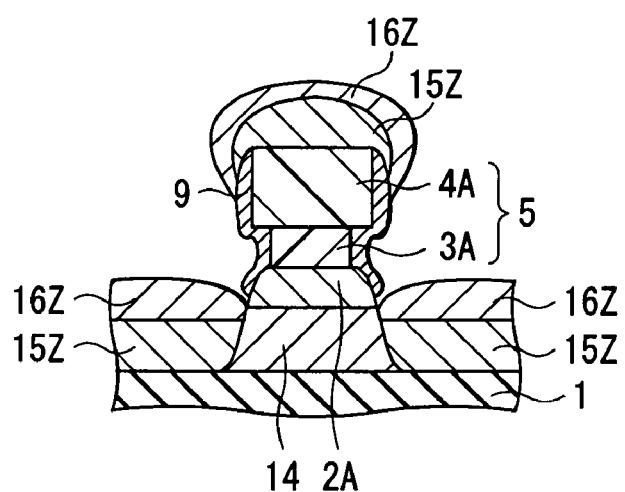
FIG. 40 is a cross section showing a process subsequent to FIG. 39.
Figure 41:
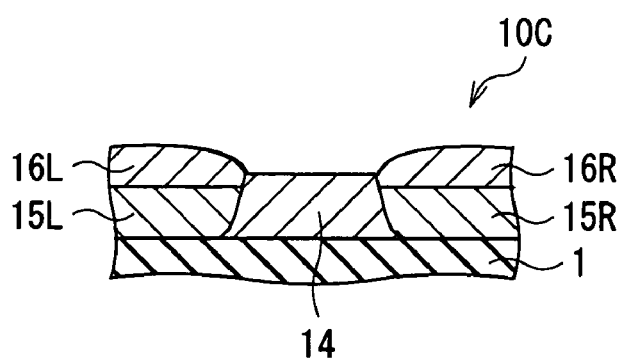
FIG. 41 is a cross section showing a process subsequent to FIG. 40.

After that, as shown in FIG. 40, the ferromagnetic film 15Z and the conductive film 16Z are sequentially stacked so as to cover the substrate 1 exposed by etching and the bilayer resist pattern 5. The ferromagnetic film 15Z and the conductive film 16Z are a concrete example corresponding to a "metal film" in the invention. Finally, the bilayer resist pattern 5 covered with the ferromagnetic film 15Z and the conductive film 16Z is removed by lift-off operation. By using a predetermined solvent capable of dissolving both the bilayer resist pattern 5 and the soluble layer pattern 2A, for example, an organic solvent such as N-methyl pyrrolidone held at 50° C., the bilayer resist pattern 5 and the soluble layer pattern 2A are dissolved and removed by a single operation, and the operations of the post-step are finished. As shown in FIG. 41, the MR element 10C having the MR film pattern 14 and the pair of magnetic domain control layers 15R and 15L and the pair of conductive lead layers 16R and 16L disposed so as to face each other and adjacent to both ends of the MR film pattern 14 is completed.

As described above, according to the embodiment, since the soluble layer 2 is formed between the MR film 14Z and the bilayer resist pattern 5, a structure that the MR film 14Z and the bilayer resist pattern 5 are separated from each other by the soluble layer 2 made of a water soluble resin such as polyvinyl alcohol can be obtained. Further, the MR film 14Z and the soluble layer 2 are selectively removed by dry etching using the bilayer resist pattern 5 as a mask, so that occurrence of deformation of the shape of the end 14T of the MR film pattern 14 can be suppressed and etching can be performed more accurately. Moreover, since both of the bilayer resist pattern 5 and the soluble layer pattern 2A are dissolved and removed by a single operation by using a solvent capable of dissolving both of the bilayer resist pattern 5 and the soluble layer pattern 2A, without causing a burr in the MR film pattern 14, the MR film pattern 14 and the bilayer resist pattern 5 can be easily separated from each other. Thus, the MR element 10C including the MR film pattern 14 having smaller dimensions can be easily formed at high precision.

EXAMPLES

Concrete examples of the first, second, and fourth embodiments in the first to sixth embodiments will now be described.

Example 1

First, a first example (Example 1) of the invention will be described. In the example, a thin film pattern having the isolated first thin film pattern 17 and the second thin film pattern 18 surrounding the first thin film pattern 17 and disposed so as to be adjacent to the periphery of the first thin film pattern 17 was formed on the basis of the thin film pattern forming method of the first embodiment. The example will be described in detail below by referring to FIGS. 2 to 8.

First, as shown in FIG. 2, the disc-shaped substrate 1 made of altic ($Al_2O_3$.TiC), having a thickness of 2 mm, and a diameter of 76.2 mm (3 inches) was prepared. The first thin film 17Z made of tantalum was formed by sputtering so as to have a thickness of 30 nm on the whole face of the substrate 1. A sputtering apparatus SPF-740H manufactured by Anelva Corporation was used and the power was set to 1500 W (direct current). A target made of tantalum and having a diameter of 203.2 mm (8 inches) was used. The flow rate of argon in a film forming chamber was set to 15 sccm (the flow rate in cubic centimeter unit per minute when pressure is converted to one atmosphere ($=1.01325 \times 10^5$ Pa)), and the pressure in the film forming chamber was set to 0.25 Pa. Further, the deposit speed of the first thin film 17Z was set to 15 nm per second.

Next, "LOL-500" made by Shipley Far East Ltd. was applied so as to cover the whole face of the first thin film 17Z by using spin coating, and heating process at 180° C. was performed for 300 seconds, thereby forming the lower resist layer 3 having a thickness of about 54 nm. After that, "AZ5105P" made by Clariant (Japan) K.K. was applied by spin coating so as to cover the lower resist layer 3, heating process was performed for 60 seconds at 120° C., and the upper resist layer 4 was formed so as to have a thickness of 0.5 μm.

Next, as shown in FIG. 3, the lower and upper resist layers 2 and 3 were selectively exposed via the photo mask 6, thereby forming the latent image portion 4E. In this case, exposure was performed by the exposure apparatus NSR-TFHEX14C manufactured by Nikon Corporation. As the exposure parameters, numerical aperture NA was set to 0.6, aperture (the ratio between the numerical aperture NA of a lighting system and the NA of a lens) σ was set to 0.75, and an exposure amount (dose amount) was set to 20 mJ/cm² so as to achieve best focus. After the exposure, heating process was performed for 60 seconds in the atmosphere of 120° C., further, a process of developing the latent image portion 4E by puddle development (once for 20 seconds) by using a tetramethyl ammonium hydroxide (TMAH) aqueous solution having concentration of 2.38% was performed, and washing and drying was carried out. In such a manner, as shown in FIGS. 4A and 4B, the isolated bilayer resist pattern 5 having an island shape defined by the contour 7A was formed. Specifically, the width W1 of the first area 5A became 0.18 μm and the length became 3 μm. The second area 5B had 3 μm per side. The width W2 of the undercut portion 8 became 0.052 μm.

After formation of the isolated bilayer resist pattern 5, as shown in FIGS. 5A and 5B, the soluble layer 2 was formed by using, for example, sputtering so as to generally and continuously cover both of the bilayer resist pattern 5 and the first thin film 17Z in the area other than the area covered with the bilayer resist pattern 5. In this case, the soluble layer 2 was formed by using an aqueous solution containing 0.1% of polyvinyl alcohol so as to have a thickness of 2 nm.

After formation of the soluble layer 2, as shown in FIG. 6, the first thin film 17Z was selectively etched by milling using the bilayer resist pattern 5 covered with the soluble layer 2 as a mask, thereby forming the isolated first thin film pattern 17 having the same island shape as that of the bilayer resist pattern 5. Concrete milling parameters are as shown in Table 1. In this case, the soluble layer 2 functioned as a protection film and deformation of the shape of the bilayer resist pattern 5 could be prevented. Accordingly, deposition of the re-deposit 9 was reduced. Further, the soluble layer 2 in the part covering the first thin film 17Z functioned as a protection film so that deformation of the shape of the end 17T of the first thin film pattern 17 patterned did not occur.

TABLE 1

| MILLING PARAMETERS | |
|---|---|
| DEVICE | "IBE-IBD" MANUFACTURED BY VEECO INSTRUMENTS INC. |
| GAS | ARGON (Ar) |
| GAS VOLUME FLOW | 10 sccm |
| PRESSURE | $2.666 \times 10^{-2}$ Pa |
| MILLING ANGLE | 5° (ANGLE TO PERPENDICULAR OF SUBSTRATE SIDE) |
| BEAM CURRENT | 300 mA |
| BEAM VOLTAGE | 300 V (DIRECT CURRENT) |
| ACCELERATION VOLTAGE | −500 V |

After that, as shown in FIG. 7, the second thin film 18Z was formed so as to cover the substrate 1 exposed by the etching and the bilayer resist pattern 5. In this case, gold (Au) was used as the material and the second thin film 18Z was formed by sputtering so as to have a thickness of 50 nm. Concrete sputtering parameters are as shown in Table 2.

TABLE 2

| SPUTTERING PARAMETERS | |
|---|---|
| DEVICE | "IBE-IBD" MANUFACTURED BY VEECO INSTRUMENTS INC. |
| GAS | ARGON (Ar) |
| GAS VOLUME FLOW | 5 sccm |
| PRESSURE | $2.666 \times 10^{-2}$ Pa |
| SPUTTERING ANGLE | 30° (ANGLE TO PERPENDICULAR OF SUBSTRATE SIDE) |
| BEAM CURRENT | 300 mA |
| BEAM VOLTAGE | 1500 V (DIRECT CURRENT) |
| ACCELERATION VOLTAGE | −200 V |

Finally, the bilayer resist pattern 5 covered with the second thin film 18Z was removed by lift-off operation. In this case, by soaking and rocking the bilayer resist pattern 5 and the soluble layer pattern 2A in a solvent which can dissolve both the bilayer resist pattern 5 and the soluble layer pattern 2A, specifically, in N-methyl pyrrolidone held at 50° C. for one hour, the bilayer resist pattern 5 and the soluble layer pattern 2A were dissolved and removed by a single operation. By the operation, as shown in FIG. 8, a thin film pattern which has the isolated first thin film pattern 17 having an island shape defined by the contour 7 (refer to FIG. 1A) and the second thin film pattern 18 surrounding the first thin film pattern 17 and disposed adjacent to the periphery of the first thin film pattern 17 was completed.

The first and second thin film patterns 17 and 18 of Example 1 manufactured as described above were visually observed with a scanning electron microscope ("CD-SEM S7800" manufactured by Hitachi, Ltd.) and it could be recognized that no burr occurs in/around the border portion between the first and second thin film patterns 17 and 18. In contrast, in a thin film pattern as a comparative example in which the soluble layer 2 is not formed, occurrence of a burr was recognized at the probability of about 50%.

As described above, in Example 1, it was found that deformation of the shape of the resist pattern can be suppressed and the thin film pattern having sufficient precision can be formed.

Example 2

A second example (Example 2) of the invention will now be described. In Example 2, a thin film pattern having the isolated first thin film pattern 17 and the second thin film pattern 18 surrounding the first thin film pattern 17 and disposed so as to be adjacent to the periphery of the first thin film pattern 17 was formed on the basis of the thin film pattern forming method of the second embodiment. The example will be described in detail below by referring to FIGS. 15A and 15B to FIG. 18. In Example 2, the operations were performed in a manner similar to Example 1 until formation of the bilayer resist pattern 5 having the undercut portion 8, so that their description will not be repeated here.

After forming the bilayer resist pattern 5 having the undercut portion 8, as shown in FIGS. 15A and 15B, the protection layer 22 was formed so as to cover the portion except for the undercut portion 8 in the bilayer resist pattern 5 and the first thin film 17Z in the area other than the area covered with the bilayer resist pattern 5. Concretely, the protection layer 22 was formed by sputtering by using a nickel iron alloy (NiFe) so as to have a thickness of 0.5 nm. Concrete sputtering parameters were as shown in Table 2.

After formation of the protection layer 22, as shown in FIG. 16, the first thin film 17Z was selectively etched by using the bilayer resist pattern 5 covered with the protection layer 22 as a mask by ion milling, thereby forming the isolated first thin film pattern 17 having the same island shape as that of the bilayer resist pattern 5. The milling parameters are as shown in Table 1. In this case, by the protection layer 22, in a manner similar to Example 1, deformation of the shape of the bilayer resist pattern 5 due to heat of the ion milling and the like could be suppressed and adhesion of the re-deposit 9 could be reduced.

After that, as shown in FIG. 17, the second thin film 18Z was formed by sputtering by using gold (Au) as the material so as to cover the substrate 1 exposed by the etching and the bilayer resist pattern 5. Sputtering parameters are as shown in Table 2. Finally, the bilayer resist pattern 5 covered with the second thin film 18Z was removed by lift-off operation. In this case, a solvent capable of dissolving the bilayer resist pattern 5, to be specific, N-methyl pyrrolidone held at 50° C. was used. By the operation, as shown in FIG. 18, a thin film pattern which has the isolated first thin film pattern 17 having an island shape defined by the contour 7 and the second thin film pattern 18 surrounding the first thin film pattern 17 and disposed adjacent to the periphery of the first thin film pattern 17 was completed.

The first and second thin film patterns 17 and 18 of Example 2 manufactured as described above were visually observed with a scanning electron microscope ("CD-SEM S7800" manufactured by Hitachi, Ltd.) and it could be recognized that no burr occurs in/around the border portion between the first and second thin film patterns 17 and 18.

As described above, also in Example 2, it was found that deformation of the shape of the resist pattern can be suppressed and the thin film pattern having sufficient precision can be formed.

Example 3

A third example (Example 3) of the invention will now be described. In Example 3, a thin film pattern having the isolated first thin film pattern 17 and the second thin film pattern 18 surrounding the first thin film pattern 17 and disposed so as to be adjacent to the periphery of the first thin film pattern 17 was formed on the basis of the thin film pattern forming method of the fourth embodiment. The example will be described in detail below by referring to FIGS. 26 to 31.

First, as shown in FIG. 26, the disc-shaped substrate 1 made of altic ($Al_2O_3.TiC$) having a thickness of 2 mm and a diameter of 76.2 mm (3 inches) was prepared. Next, the first thin film 17Z made of tantalum was formed on the whole surface of the substrate 1 by sputtering so as to have a thickness of 30 nm. A sputtering apparatus SPF-740H manufactured by Anelva Corporation was used and the power was set to 1500 W (direct current). A target made of tantalum and having a diameter of 203.2 mm (8 inches) was used. The flow rate of argon in a film forming chamber was set to 15 sccm (the flow rate in cubic centimeter unit per minute when pressure is converted to one atmosphere), and the pressure in the film forming chamber was set to 0.25 Pa. Further, the deposit speed of the first thin film 17Z was set to 15 nm per second.

Next, the soluble layer 2 was formed by using, for example, sputtering so as to cover the whole surface of the first thin film 17Z. In this case, two samples were made; a sample in which copper (Cu) was used as the material and the soluble layer 2 was formed so as to have a thickness of 0.5 nm (example 3-1), and a sample in which NiFe was used as the material and the soluble layer 2 was formed so as to have a thickness of 0.5 nm (example 3-2). Film forming conditions in Example 3-1 and those of Example 3-2 were the same except for the target materials. Concrete conditions are as shown in Table 2.

After formation of the soluble layer 2, "LOL-500" made by Shipley Far East Ltd. was applied by spin coating, and heating process at 180° C. was performed for 300 seconds, thereby forming the lower resist layer 3 having a thickness of about 50 nm. After that, "AZ5105P" made by Clariant (Japan) K.K. was applied by spin coating so as to cover the lower resist layer 3, heating process was performed for 60 seconds at 120° C., and the upper resist layer 4 was formed so as to have a thickness of 0.5 μm.

Next, as shown in FIG. 27, the lower and upper resist layers 2 and 3 were selectively exposed via the photo mask 6, thereby forming the latent image portion 4E. In this case, exposure was performed by the exposure apparatus NSR-TFHEX14C manufactured by Nikon Corporation. As the exposure parameters, numerical aperture NA was set to 0.6, aperture (the ratio between the numerical aperture NA of a lighting system and the NA of a lens) σ was set to 0.75, and an exposure amount (dose amount) was set to 20 mJ/cm² so as to achieve best focus. After the exposure, heating process was performed for 60 seconds in the atmosphere of 120° C., further, a process of developing the latent image portion 4E by puddle development (once for 20 seconds) by using a tetramethyl ammonium hydroxide (TMAH) aqueous solution having concentration of 2.38% was performed, and washing and drying was carried out. In such a manner, as shown in FIGS. 28A and 28B, the isolated bilayer resist pattern 5 having an island shape defined by the contour 7A was formed. Specifically, the width W1 of the first area 5A became 0.18 μm and the length became 3 μm. The second area 5B had 3 μm per side. The width W2 of the undercut portion 8 became 0.05 μm.

After formation of the isolated bilayer resist pattern 5, as shown in FIG. 29, the first thin film 17Z and the soluble layer 2 were selectively etched by milling using the bilayer resist pattern 5 as a mask, thereby forming the isolated first thin film pattern 17 having the same island shape as that of the bilayer resist pattern 5 and the soluble layer pattern 2A. Concrete milling parameters are as shown in Table 1.

After that, as shown in FIG. 30, the second thin film 18Z was formed so as to cover the substrate 1 exposed by the etching and the bilayer resist pattern 5. In this case, gold (Au) was used as the material and the second thin film 18Z was formed by sputtering so as to have a thickness of 50 nm. Concrete sputtering parameters are as shown in Table 2.

Finally, the bilayer resist pattern 5 covered with the second thin film 18Z was removed by lift-off operation. In this case, by soaking and rocking the bilayer resist pattern 5 and the soluble layer pattern 2A in a predetermined solvent which can dissolve both the bilayer resist pattern 5 and the soluble layer pattern 2A (N-methyl pyrrolidone held at 50° C. in Example 3-1 and a mixed organic solvent of aromatic hydrocarbon (60 wt %), phenol (20 wt %), and octyl benzenesulfonic acid (20 wt %) held at 90° C. in Example 3-2) for one hour, the bilayer resist pattern 5 and the soluble layer pattern 2A were dissolved and removed by a single operation. By the operation, as shown in FIG. 31, a thin film pattern which has the isolated first thin film pattern 17 having an island shape defined by the contour 7 and the second thin film pattern 18 surrounding the first thin film pattern 17 and disposed adjacent to the periphery of the first thin film pattern 17 was completed at high precision without a burr or the like.

The first and second thin film patterns 17 and 18 of Examples 3-1 and 3-2 manufactured as described above were visually observed with a scanning electron microscope ("CD-SEM S7800" manufactured by Hitachi, Ltd.) and it could be recognized that no burr occurs in/around the border portion between the first and second thin film patterns 17 and 18. In contrast, in a thin film pattern as a comparative example in which the soluble layer 2 (soluble layer pattern 2A) is not formed, occurrence of a burr was recognized at the probability of about 50%.

From the above, in Example 3, it was found that the thin film pattern having sufficient precision can be formed without causing a burr.

The invention has been described above by some embodiments and examples. The invention is not limited to the foregoing embodiments and examples but can be variously modified. For example, although a photoresist material of a positive type is used for forming the upper resist layer in the foregoing embodiments and examples, a photoresist material of a negative type may be used. Although the resist pattern of the bilayer structure is manufactured in the foregoing embodiments and examples, a resist pattern of a single layer may be also employed. In the case of using the resist pattern of a single layer, it is desired to use a resin which also allows formation of the undercut portion by the photolithography process.

Although an MR element of a bottom spin valve type has been described as an example of the magnetoresistive element in the foregoing embodiments, the invention is not limited to the MR element of the bottom spin valve type. Alternately, an MR element of a top spin valve type or a tunneling magnetoresistive (TMR) element may be employed.

In the first, second, fourth and fifth embodiments, the case of forming the second thin film pattern in addition to the first thin film pattern has been described. In any of the cases, only the first thin film pattern may be formed.

In the third embodiment, the thin film pattern forming method of the first embodiment is applied and the step of forming the soluble layer functioning also as the protection layer so as to continuously cover the magnetoresisive film and the whole resist pattern formed so as to selectively cover the magnetoresistive film is included. However, the invention is not limited to the method. It is also possible to apply the thin film pattern forming method of the second embodiment and include a step of forming an undercut portion in the resist pattern selectively covering the magnetoresistive film and, after that, forming a protection layer so as to cover at least the portion other than the undercut portion in the resist pattern.

In the fourth to sixth embodiments and Example 3, the case of removing both of the resist pattern and the soluble layer pattern by a single operation by using a solvent which can dissolve both the resist pattern and the soluble layer pattern has been described. However, the invention is not limited to the case. The effects of the invention can be obtained by using a solvent which can dissolve at least the soluble layer pattern.

The thin film pattern forming method of the invention is not limited to formation of a magnetoresistive element in a thin film magnetic head but can be also suitably used for formation of various thin film patterns included in other electronic/magnetic devices such as a semiconductor device. For example, the method can be applied to formation of a wiring pattern in a micro machine, pattern formation of a thin film magnetic memory device in a nonvolatile magnetoresistive memory (MRAM: Magnetoresistive Random Access Memory), and the like.

What is claimed is:

1. A thin film pattern forming method comprising:
    a step of forming a first thin film on a substrate;
    a step of forming a resist pattern, the resist pattern having a two-layer structure including a first resist layer and a second resist layer which are composed of respectively different insulating materials,
    a step of forming an undercut in the resist pattern;
    a step of forming a covering layer that covers the first thin film and the resist pattern including surfaces of the undercut of the resist pattern so as to form a coated resist pattern, the covering layer being a soluble layer; and
    a step of forming the first thin film pattern by selectively removing the first thin film by dry etching using the resist pattern as a mask,
    wherein the formation of the undercut forms a vertical shape of the resist pattern in which a lower part of the resist pattern is narrower than an upper part of the resist pattern, and the covering layer is provided on the whole surface of the resist pattern and is formed so as to generally have the shape of the undercut in that a lower part of the coated resist pattern corresponding to the lower part of the resist pattern is narrower than an upper part of the coated resist pattern corresponding to the upper part of the resist pattern.

2. A thin film pattern forming method according to claim 1, wherein the resist pattern is formed so as to selectively cover the first thin film,
    the soluble layer as the covering layer is formed so as to generally and continuously cover the resist pattern and the first thin film and,
    further, a resist pattern covered with the soluble layer is removed by using a solvent which can dissolve both the resist pattern and the soluble layer.

3. A thin film pattern forming method according to claim 2, further comprising a step of forming a second thin film so as to cover an area from which the resist pattern covered with the soluble layer and the first thin film have been removed,
    wherein a second thin film pattern is formed by removing the resist pattern covered with the second thin film.

4. A thin film pattern forming method according to claim 2, wherein the soluble layer is formed by using an inorganic material.

5. A thin film pattern forming method according to claim 4, wherein a metal containing at least copper (Cu) is used as the inorganic material and an organic solvent containing at least N-methyl pyrrolidone is used as the solvent.

6. A thin film pattern forming method according to claim 4, wherein a metal containing at least nickel (Ni) and iron (Fe) is used as the inorganic material and an organic solvent containing at least aromatic hydrocarbon, phenol, and octyl benzenesulfonic acid is used as the solvent.

7. A thin film pattern forming method according to claim 2, wherein the soluble layer is formed by using an organic material.

8. A thin film pattern forming method according to claim 7, wherein a water soluble resin is used as the organic material and an organic solvent containing at least N-methyl pyrrolidone is used as the solvent.

9. A thin film pattern forming method according to claim 7, wherein diamond like carbon (DLC) is used as the organic material and an organic solvent containing at least N-methyl pyrrolidone is used as the solvent.

10. A thin film pattern forming method according to claim 1, wherein the resist pattern of an isolated type having an island or band shape is formed, and the first thin film pattern of an isolated type having the same shape as that of the isolated resist pattern is formed.

11. A thin film pattern forming method according to claim 1, wherein the resist pattern having an opening is formed, and the first thin film pattern having an opening whose shape is the same as that of the opening of the resist pattern is formed.

12. A thin film pattern forming method according to claim 1, wherein the soluble layer as the covering layer and the resist pattern are sequentially formed on the first thin film,
    a soluble layer pattern is formed together with the first thin film pattern by selectively removing the first thin film and the soluble layer by performing dry etching using the resist pattern as a mask and,
    further, at least the soluble layer pattern is removed by using a solvent which can dissolve at least the soluble layer pattern.

13. A thin film pattern forming method according to claim 12, further comprising a step of forming a second thin film so as to cover an area from which the resist pattern, the first thin film, and the soluble layer have been removed,
    wherein a second thin film pattern is formed by removing at least the soluble layer pattern by using the solvent.

14. A thin film pattern forming method according to claim 12, wherein the resist pattern is removed together with the soluble layer pattern by using a solvent which can dissolve also the resist pattern as the solvent.

15. A thin film pattern forming method according to claim 12, wherein the resist pattern of an isolated type having an island or band shape is formed, and the first thin film pattern of an isolated type and the soluble layer pattern having the same shape as that of the isolated resist pattern are formed.

16. A thin film pattern forming method according to claim 12, wherein the resist pattern having an opening is formed, and the first thin film pattern and the soluble layer pattern having an opening whose shape is the same as that of the opening of the resist pattern are formed.

17. A thin film pattern forming method according to claim 1, the first resist layer having a main component of polymethylglutarimide as an alkali soluble resin and the second resist layer having a main component of polyhydroxy styrene.

18. A magnetoresistive element forming method comprising:
   a step of forming a magnetoresistive film on a substrate;
   a step of forming a resist pattern, the resist pattern having a two-layer structure including a first resist layer and a second resist layer which are composed of respectively different insulating materials;
   a step of forming an undercut in the resist pattern;
   a step of forming a covering layer that covers the first thin film and the resist pattern including surfaces of the undercut of the resist pattern so as to form a resist pattern, the covering layer being a soluble layer; and
   a step of forming a magnetoresistive film pattern by selectively removing the magnetoresistive film by dry etching using the resist pattern as a mask,
   wherein the formation of the undercut forms a vertical shape of the resist pattern in which a lower part of the resist pattern is narrower than an upper part of the resist pattern, and the covering layer is provided in the whole surface of the resist pattern and is formed so as to generally have the shape of the undercut in that a lower part of the coated resist pattern corresponding to the lower part of the resist pattern is narrower than an upper part of the coated resist pattern corresponding to the upper part of the resist pattern.

19. A magnetoresistive element forming method according to claim 18, wherein the resist pattern is formed so as to selectively cover the magnetoresistive film,
   the soluble layer as the covering layer is formed so as to generally and continuously cover the resist pattern and the magnetoresistive film and,
   the method further comprises:
   a step of forming a metal film including at least a ferromagnetic film so as to cover an area from which the resist pattern and the magnetoresistive film covered with the soluble layer have been removed; and
   a step of forming a pair of metal film patterns including a magnetic domain control layer so as to face each other while sandwiching the magnetoresistive film pattern by removing the resist pattern covered with the soluble layer by using a solvent which can dissolve both the resist pattern and the soluble layer.

20. A magnetoresistive element forming method according to claim 19, wherein in the step of forming the metal film, a conductive film is formed on the ferromagnetic film, and the pair of metal film patterns are formed so that each metal film pattern includes a conductive lead layer.

21. A magnetoresistive element forming method according to claim 18, wherein the soluble layer as the covering layer and the resist pattern are sequentially formed on the magnetoresistive film,
   a soluble layer pattern is formed together with the magnetoresistive film pattern by selectively removing the magnetoresistive film and the soluble layer by performing dry etching using the resist pattern as a mask and,
   the method further comprises a step of forming a pair of metal film patterns including a magnetic domain control layer so as to face each other while sandwiching the magnetoresistive film pattern by removing at least the soluble layer pattern by using a solvent which can dissolve at least the soluble layer pattern.

22. A magnetoresistive element forming method according to claim 21, wherein the resist pattern is removed together with the soluble layer pattern by using a solvent which can dissolve also the resist pattern as the solvent.

23. A magnetoresistive element forming method according to claim 21, wherein in the step of forming the metal film, a conductive film is formed on the ferromagnetic film and the pair of metal film patterns is formed so that each metal film pattern includes a conductive lead layer.

24. A magnetoresistive element forming method according to claim 18, the first resist layer having a main component of polymethylglutarimide as an alkali soluble resin, and the second resist layer having a main component of polyhydroxy styrene.

* * * * *